(12) United States Patent
Komai

(10) Patent No.: US 12,199,126 B2
(45) Date of Patent: Jan. 14, 2025

(54) IMAGE SENSOR AND IMAGE-CAPTURING APPARATUS

(71) Applicant: NIKON CORPORATION, Tokyo (JP)

(72) Inventor: Atsushi Komai, Tokorozawa (JP)

(73) Assignee: NIKON CORPORATION, Tokyo (JP)

( * ) Notice: Subject to any disclaimer, the term of this patent is extended or adjusted under 35 U.S.C. 154(b) by 150 days.

(21) Appl. No.: 17/100,177

(22) Filed: Nov. 20, 2020

(65) Prior Publication Data

US 2021/0074756 A1  Mar. 11, 2021

Related U.S. Application Data

(63) Continuation of application No. 16/078,807, filed as application No. PCT/JP2017/007548 on Feb. 27, 2017, now Pat. No. 10,879,300.

(30) Foreign Application Priority Data

Feb. 29, 2016 (JP) ................................ 2016-038161

(51) Int. Cl.
*H01L 27/146* (2006.01)
*H04N 25/65* (2023.01)
(Continued)

(52) U.S. Cl.
CPC ...... *H01L 27/14643* (2013.01); *H01L 27/146* (2013.01); *H01L 27/14627* (2013.01);
(Continued)

(58) Field of Classification Search
CPC ............. H01L 27/14643; H01L 27/146; H01L 27/14627; H01L 27/14689; H04N 5/378; H04N 5/363; H04N 5/3745
See application file for complete search history.

(56) References Cited

U.S. PATENT DOCUMENTS

2004/0085465 A1\* 5/2004 Inui .................. H04N 25/65
348/241
2006/0197007 A1 9/2006 Iwabuchi et al.
(Continued)

FOREIGN PATENT DOCUMENTS

CN 104010141 A 8/2014
JP 2001-045375 A 2/2001
(Continued)

OTHER PUBLICATIONS

Aug. 2, 2022 Office Action issued in Japanese Patent Application No. 2020-173444.
(Continued)

*Primary Examiner* — Tony Ko
(74) *Attorney, Agent, or Firm* — Oliff PLC

(57) ABSTRACT

An image sensor includes: a plurality of pixels each having a photoelectric conversion unit that converts incident light into an electric charge, the incident light being incident from one side of a substrate, and an output unit that outputs a signal caused by the electric charge, the plurality of pixels being arranged in a first direction and a second direction intersecting the first direction; and an accumulation unit provided to be stacked on the photoelectric conversion unit on a side opposite to the one side of the substrate, the accumulation unit accumulating the signal.

16 Claims, 14 Drawing Sheets

(51) Int. Cl.
  *H04N 25/75*  (2023.01)
  *H04N 25/77*  (2023.01)
(52) U.S. Cl.
  CPC ....... *H01L 27/14689* (2013.01); *H04N 25/65* (2023.01); *H04N 25/75* (2023.01); *H04N 25/77* (2023.01)

(56) References Cited

U.S. PATENT DOCUMENTS

| | | |
|---|---|---|
| 2010/0289933 A1 | 11/2010 | Ryoki et al. |
| 2011/0193983 A1 | 8/2011 | Uchida |
| 2012/0057056 A1 | 3/2012 | Oike |
| 2013/0153752 A1 | 6/2013 | Sakurai |
| 2014/0239430 A1 | 8/2014 | Egawa |
| 2015/0146060 A1 | 5/2015 | Suzuki et al. |
| 2015/0228693 A1 | 8/2015 | Toda |
| 2016/0044266 A1 | 2/2016 | Oike |
| 2017/0162625 A1 | 6/2017 | Takayanagi et al. |
| 2019/0246054 A1* | 8/2019 | Kobayashi ........... H04N 25/772 |

FOREIGN PATENT DOCUMENTS

| | | | |
|---|---|---|---|
| JP | 2005-303621 A | 10/2005 | |
| JP | 2009-224524 A | 10/2009 | |
| JP | 2011-166379 A | 8/2011 | |
| JP | 2011-204797 A | 10/2011 | |
| JP | 2012-054876 A | 3/2012 | |
| JP | 2013-126174 A | 6/2013 | |
| JP | 2014-165399 A | 9/2014 | |
| JP | 2014-195112 A | 10/2014 | |
| JP | 2015-95874 A | 5/2015 | |
| JP | 2015-103958 A | 6/2015 | |
| JP | 2015-228388 A | 12/2015 | |
| WO | 2013/014839 A1 | 1/2013 | |
| WO | 2015/125611 A1 | 8/2015 | |
| WO | 2016/009943 A1 | 1/2016 | |

OTHER PUBLICATIONS

Apr. 4, 2017 International Search Report issued in International Patent Application No. PCT/JP2017/007548.

Oct. 15, 2019 Japanese Office Action issued in Japanese Patent Application No. 2018-503304.

Aug. 19, 2019 Extended European Search Report is issued in European Patent Application No. 17759935.4.

Feb. 13, 2020 Office Action issued in U.S. Appl. No. 16/078,807.

Feb. 25, 2020 Office Action issued in Japanese Patent Application No. 2018-503304.

Jul. 14, 2020 Decision of Dismissal of Amendment issued in Japanese Patent Application No. 2018-503304.

Jul. 14, 2020 Decision of Refusal issued in Japanese Patent Application No. 2018-503304.

Aug. 24, 2020 Notice of Allowance issued in U.S. Appl. No. 16/078,807.

Jul. 15, 2020 Office Action issued in Chinese Patent Application No. 201780025799.1.

Nov. 5, 2020 Office Action issued in Japanese Patent Application No. 2018-503304.

Nov. 9, 2021 Office Action issued in Japanese Patent Application No. 2020-173444.

\* cited by examiner

FIG 7

FIG.12
(a)
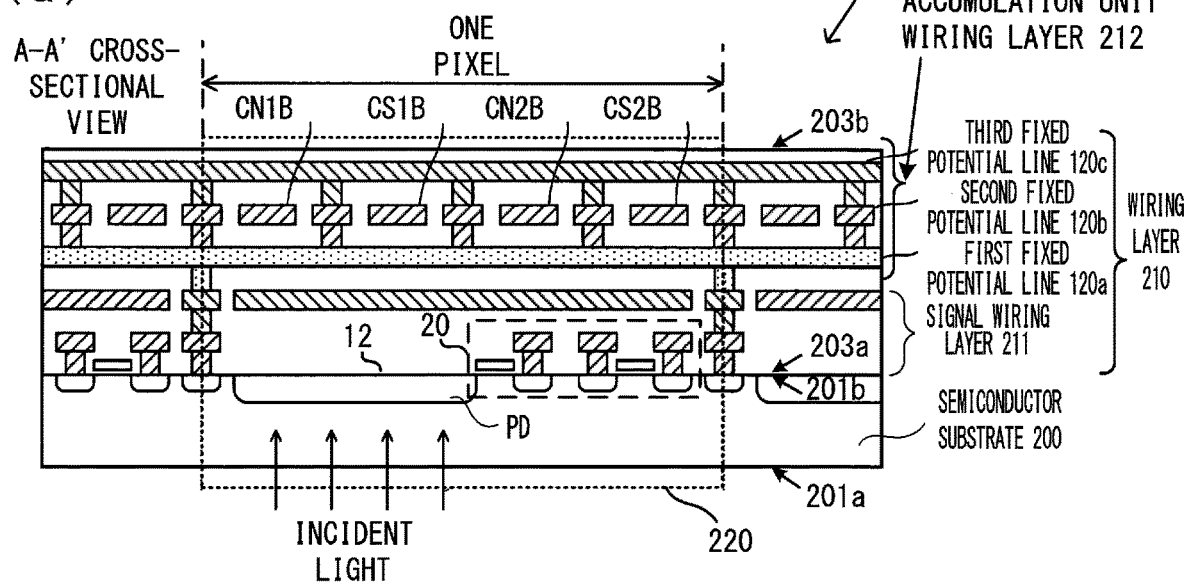
(b)
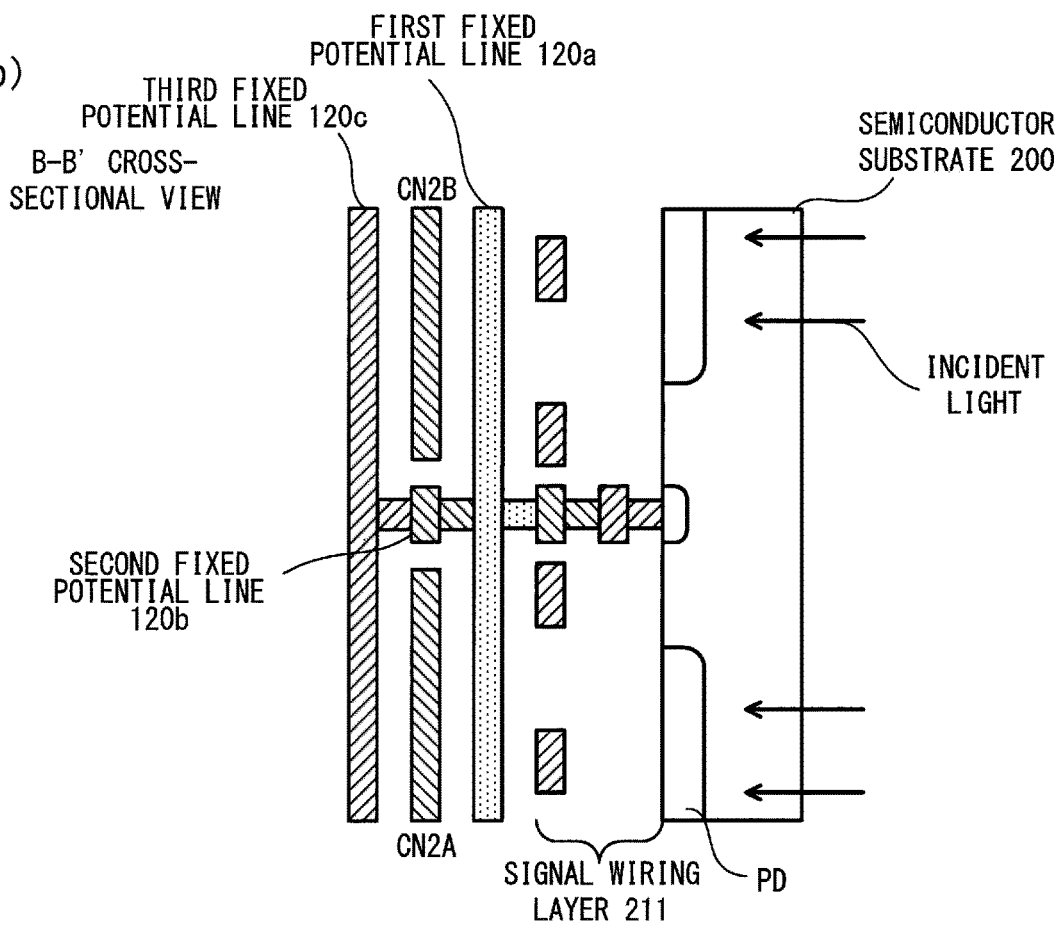

IMAGE SENSOR AND IMAGE-CAPTURING APPARATUS

This is a Continuation of application Ser. No. 16/078,807 filed Dec. 18, 2018, which is a National Stage Application of PCT/JP2017/007548 filed Feb. 27, 2017, which in turn claims priority to Japanese Application No. 2016-038161 filed Feb. 29, 2016. The entire disclosures of the prior applications are hereby incorporated by reference herein their entirety.

TECHNICAL FIELD

The present invention relates to an image sensor and an image-capturing apparatus.

BACKGROUND ART

An image sensor capable of reading out signals from pixels in a certain row, while horizontally transferring signals from pixels in another row by providing a plurality of capacitances in one pixel column is known (see PTL1). However, in the prior art, the chip area of the image sensor may be increased due to a large number of capacitances provided therein.

CITATION LIST

Patent Literature

PTL1: Japanese Laid-Open Patent Publication No. 2001-45375

SUMMARY OF INVENTION

According to the 1st aspect of the present invention, an image sensor comprises: a plurality of pixels each having a photoelectric conversion unit that converts incident light into an electric charge, the incident light being incident from one side of a substrate, and an output unit that outputs a signal caused by the electric charge, the plurality of pixels being arranged in a first direction and a second direction intersecting the first direction; and an accumulation unit provided to be stacked on the photoelectric conversion unit on a side opposite to the one side of the substrate, the accumulation unit accumulating the signal.

According to the 2nd aspect of the present invention, an image sensor comprises: a first layer having a photoelectric conversion unit that converts light incident on a first surface of a semiconductor substrate into an electric charge, and an output unit that outputs a signal caused by the electric charge on a second surface of the semiconductor substrate; and a second layer stacked on the first layer on the second surface and having an accumulation unit that accumulates the signal output by the output unit.

According to the 3rd aspect of the present invention, an image sensor comprises: a plurality of pixels each having a photoelectric conversion unit that converts light incident from an incident surface into an electric charge and outputting a signal based on the electric charge; and an accumulation unit that accumulates the signal output from the pixel, wherein: the accumulation unit is arranged between the plurality of pixels.

According to the 4th aspect of the present invention, an image sensor comprises: a plurality of pixels each having a photoelectric conversion unit that converts light incident from the incident surface into an electric charge and outputting a signal based on the electric charge; and an accumulation unit that accumulates the signal output from the pixel, wherein: the pixel is arranged between the incident surface and the accumulation unit.

According to the 5th aspect of the present invention, an image sensor comprises: a plurality of pixels each having a photoelectric conversion unit that converts incident light into an electric charge, a first accumulation unit to which the electric charge photoelectrically converted by the photoelectric conversion unit is transferred, and an output unit that outputs a signal caused by the electric charge transferred to the first accumulation unit; an output control unit that switches a pixel signal caused by the electric charge transferred from the photoelectric conversion unit to the first accumulation unit and a reset signal in which the electric charge in the first accumulation unit is reset, to output the pixel signal or the noise signal from the output unit; a second accumulation unit that accumulates the pixel signal output from the output unit; and a third accumulation unit that accumulates the reset signal output from the output unit, wherein: the pixel is arranged between a surface on which the light is incident and the second accumulation unit or the third accumulation unit.

According to the 6th aspect of the present invention, an image-capturing apparatus comprises: the image sensor according to any one of the 1st to the 5th aspects; and an image generation unit that generates image data based on the signal of the image sensor.

BRIEF DESCRIPTION OF DRAWINGS

FIG. 7 is a circuit diagram illustrating a configuration of a part of an image sensor according to a second embodiment.

FIG. 12 is a view illustrating an example of a cross-sectional structure of the image sensor according to the third embodiment.

DESCRIPTION OF EMBODIMENTS

First Embodiment

Figure 1:
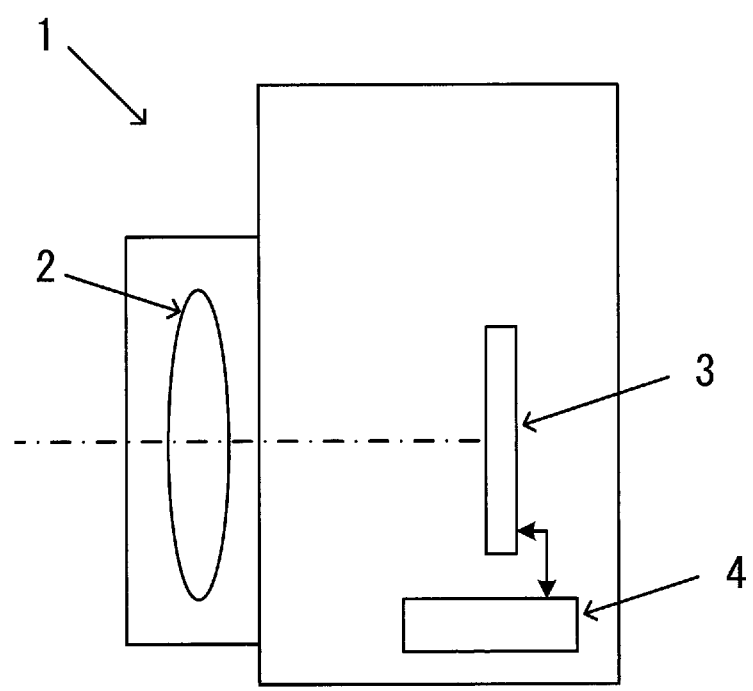
FIG. 1 is a block diagram illustrating a configuration of an image-capturing apparatus according to a first embodiment.

FIG. 1 is a block diagram illustrating a configuration of an image-capturing apparatus 1 according to a first embodiment. The image-capturing apparatus 1 includes a photographing optical system 2, an image sensor 3, and a control unit 4. The image-capturing apparatus 1 is, for example, a camera. The photographing optical system 2 forms a subject image on the image sensor 3. The image sensor 3 captures the subject image formed by the photographing optical system 2 and generates an image signal. The image sensor 3 is, for example, a CMOS image sensor. The control unit 4 outputs, to the image sensor 3, a control signal for controlling the operation of the image sensor 3. Additionally, the control unit 4 performs various types of image processing on the image signal output from the image sensor 3 and functions as an image generation unit generating image data. Note that the photographing optical system 2 may be detachable from the image-capturing apparatus 1.

Figure 2:
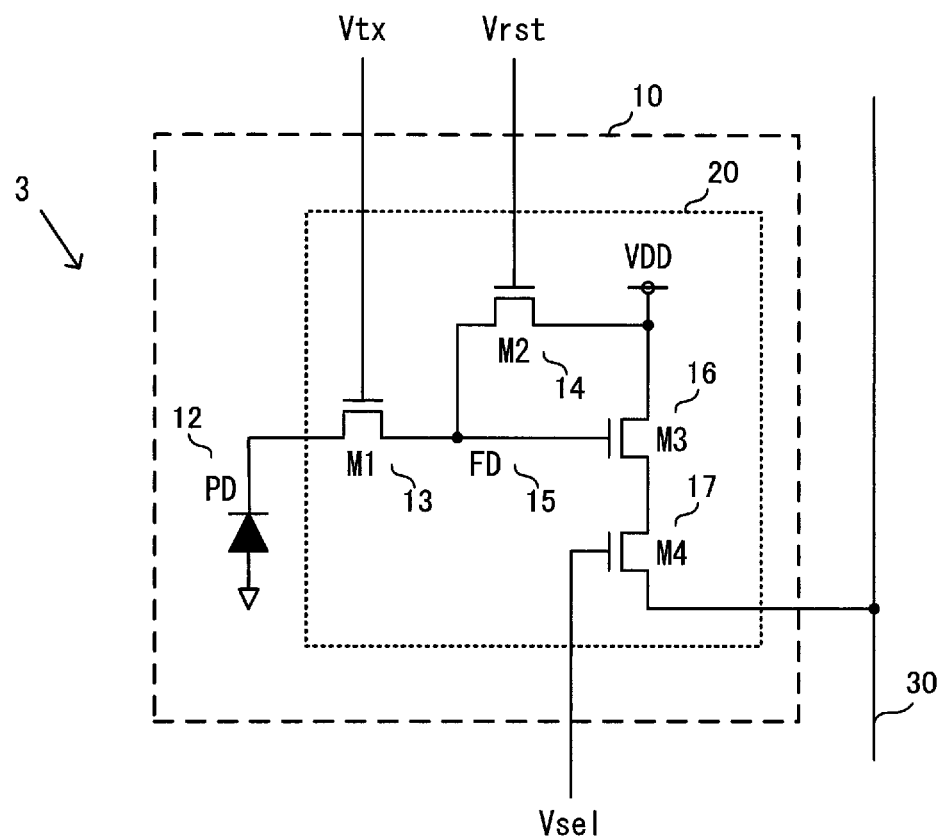
FIG. 2 is a circuit diagram illustrating a configuration of a pixel according to the first embodiment.

FIG. 2 is a circuit diagram illustrating a configuration of a pixel 10 according to the first embodiment. The image sensor 3 has a plurality of pixels 10 arranged two-dimensionally. The pixel 10 has a photoelectric conversion unit 12, such as a photodiode (PD), and a readout unit 20. The photoelectric conversion unit 12 has a function of converting incident light into an electric charge and accumulating the photoelectrically converted electric charge. The readout unit 20 includes a transfer unit 13, a discharge unit 14, a floating diffusion (FD) 15, an amplification unit 16, and a selection unit 17.

The transfer unit 13 is controlled by a signal Vtx to transfer the electric charge photoelectrically converted by the photoelectric conversion unit 12 to the floating diffusion 15. In other words, the transfer unit 13 forms an electric charge transfer path between the photoelectric conversion unit 12 and the floating diffusion 15. The floating diffusion 15 holds (accumulates) the electric charge. The amplification unit 16 amplifies a signal caused by the electric charge held in the floating diffusion 15 to output the signal to a vertical signal line 30 via the selection unit 17. In the example illustrated in FIG. 2, the amplification unit 16 includes a transistor M3 having a drain terminal, a gate terminal, and a source terminal, which are respectively connected to a power supply VDD, the floating diffusion 15, and the selection unit 17. The source terminal of the amplification unit 16 is connected to the vertical signal line 30 via the selection unit 17. The amplification unit 16 functions as a part of a source follower circuit with an electric current source 60 (described later) as a load electric current source.

The discharge unit (reset unit) 14 is controlled by a signal Vrst to discharge the electric charge of the floating diffusion 15 and reset a potential of the floating diffusion 15 to a reset potential (reference potential). The selection unit 17 is controlled by a signal Vsel to output the signal from the amplification unit 16 to the vertical signal line 30. For example, the transfer unit 13, the discharge unit 14, and the selection unit 17 respectively include a transistor M1, a transistor M2, and a transistor M4.

The readout unit 20 reads out, to the vertical signal line 30, a signal (a photoelectric conversion signal) corresponding to the electric charge transferred by the transfer unit 13 from the photoelectric conversion unit 12 to the floating diffusion 15 and a signal (a noise signal) at a time of resetting the potential of the floating diffusion 15 to the reset potential. The noise signal is a reference signal indicating a reference level for the photoelectric conversion signal. Furthermore, the amplification unit 16 and the selection unit 17 constitute an output unit that outputs a signal caused by the electric charge accumulated in the floating diffusion 15. The output unit outputs the photoelectric conversion signal and the noise signal to the vertical signal line 30.

Figure 3:
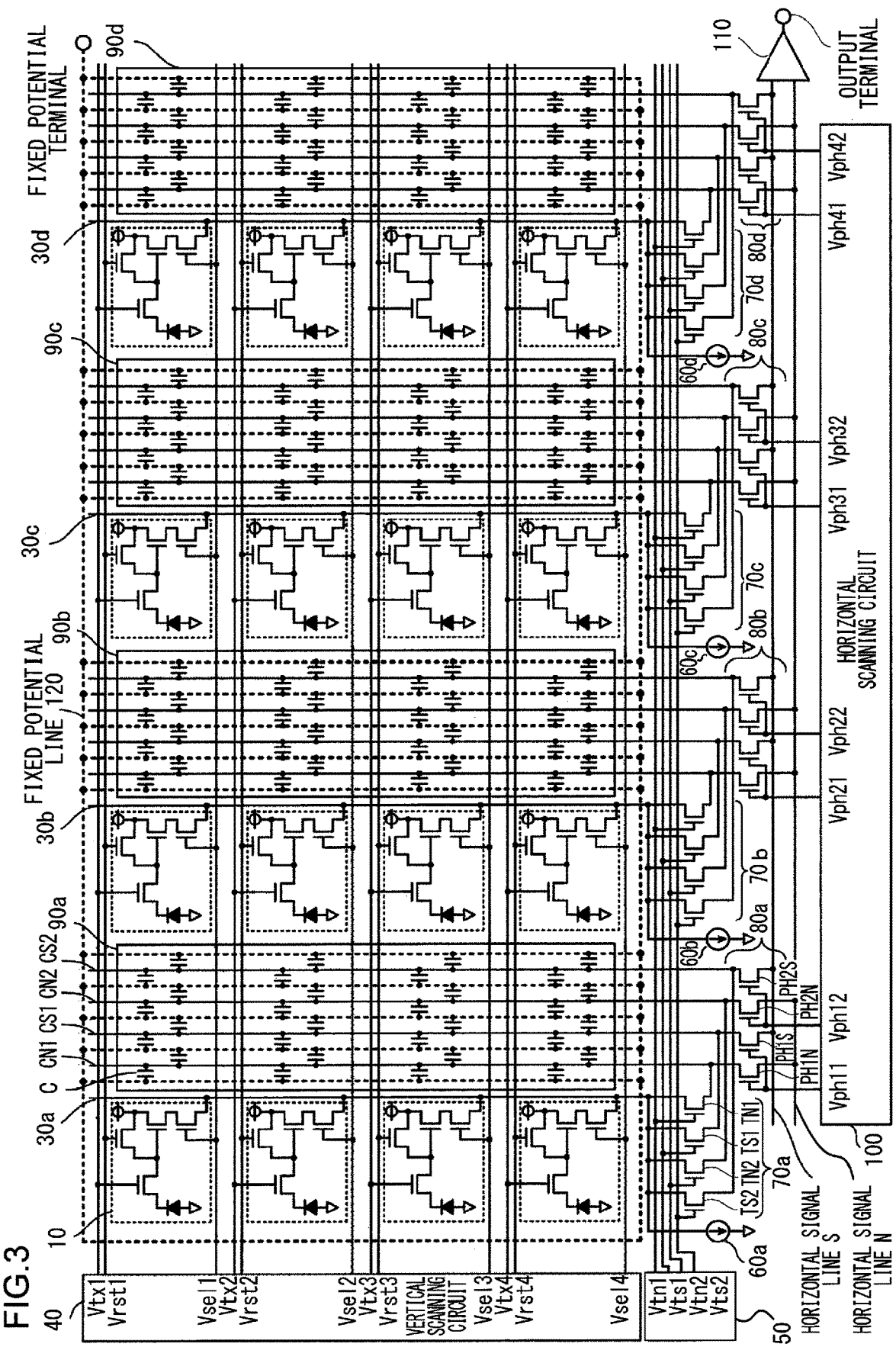
FIG. 3 is a circuit diagram illustrating a configuration of a part of an image sensor according to the first embodiment.

FIG. 3 is a circuit diagram illustrating a configuration of a part of the image sensor 3 according to the first embodiment. The image sensor 3 includes a plurality of pixels 10 arranged in a matrix, a vertical scanning circuit 40, a selection circuit 50, electric current sources 60 (electric current sources 60a-60d), first switch units 70 (first switch units 70a-70d), second switch units 80 (second switch units 80a-80d), accumulation units 90 (accumulation units 90a-90d), a horizontal scanning circuit 100, and an output amplifier unit 110. FIG. 3 illustrates a circuit diagram having the accumulation units 90 juxtaposed with the pixels 10, for ease of comprehension; however, practically, the accumulation units 90 are arranged to be stacked on a semiconductor substrate in a pixel region where the pixels 10 are densely arranged in a matrix. The pixel region is a region where the plurality of pixels 10 each having the photoelectric conversion unit 12 and the readout unit 20 are arranged two-dimensionally. In other words, in the pixel region, a plurality of pixels 10 are arranged in a first direction (e.g., column direction) and a second direction (e.g., row direction) intersecting the first direction. Outside the pixel region, peripheral circuits (the vertical scanning circuit 40, the horizontal scanning circuit 100, etc.) are arranged.

In FIG. 3, an accumulation unit 90a is provided at a pixel region where a first pixel column at the leftmost is arranged, and an accumulation unit 90b is provided at a pixel region where a second pixel column, which is adjacent to the first pixel column on the right, is arranged. Similarly, an accumulation unit 90c and an accumulation unit 90d are respectively provided to correspond to a third pixel column and a fourth pixel column, which is adjacent to the third column on the right. In the present embodiment, the accumulation units 90 are provided to be stacked on the semiconductor substrate at the pixel regions. The accumulation units 90 are juxtaposed with the pixels 10 in a direction in which the accumulation units 90 are stacked on the semiconductor substrate. This achieves a large capacitance value without increasing a chip area.

An accumulation unit 90, an electric current source 60, a first switch unit 70, and a second switch unit 80 are provided for each pixel column including a plurality of pixels 10 arranged in the column direction, that is, in the vertical direction. In other words, in FIG. 3, one accumulation unit 90, one electric current source 60, one first switch unit 70, and one second switch unit 80 are provided corresponding to the first pixel column at the leftmost. Similarly, another accumulation unit 90, another electric current source 60, another first switch unit 70, and another second switch unit 80 are provided corresponding to each of the second pixel column adjacent to the first pixel column on the right, the third pixel column adjacent to the second pixel column on the right, and the fourth pixel column adjacent to the third pixel column on the right.

Furthermore, a vertical signal line 30 (respectively, vertical signal lines 30a-30d) is provided corresponding to each column of the pixels 10. Note that the example in FIG. 3 illustrates only four pixels 10 in the horizontal direction and four pixels 10 in the vertical direction, for simplification of explanation.

The electric current sources 60a-60d are provided respectively corresponding to the vertical signal lines 30a-30d and connected to the vertical signal lines 30a-30d. Additionally, the electric current sources 60a-60d are connected to respective pixels 10 via the vertical signal lines 30a-30d, respectively. The electric current sources 60a-60d generate electric currents for reading out photoelectric conversion signals and noise signals from the respective pixels 10. The electric current sources 60a-60d respectively supply generated electric currents to the vertical signal lines 30a-30d and the respective pixels 10.

The vertical scanning circuit 40 supplies control signals such as a signal Vtxn, a signal Vrstn, and a signal Vseln to each pixel 10. The vertical scanning circuit 40 outputs a signal Vtxn and other signals to a pixel 10 to control the operation of the pixel 10. Note that the "n" at the end of "Vtxn", "Vrstn", "Vseln" indicates a row number of a pixel. For example, a signal Vtx1 is a signal for controlling transfer units 13 of pixels 10 in a first row.

The first switch units 70a-70d are provided respectively corresponding to the vertical signal lines 30a-30d and connected to the vertical signal lines 30a-30d. The first switch units 70a-70d respectively switch electrical connection states between the vertical signal lines 30a-30d and the accumulation units 90a-90d. The first switch units 70a-70d are controlled by control signals output from the selection circuit 50 to transfer the photoelectric conversion signals and the noise signals output from the pixels 10 to the accumulation units 90a-90d, respectively. Each of the first switch units 70a-70d has a switch TN1, a switch TS1, a switch TN2, and a switch TS2. The switch TN1, the switch TS1, the switch TN2, and the switch TS2 each include a transistor.

The second switch units 80a-80d are provided respectively corresponding to the vertical signal lines 30a-30d. The second switch units 80a-80d respectively switch electrical connection states between the accumulation units 90a-90d and the output amplifier unit 110. The second switch units 80a-80d are controlled by control signals output from the horizontal scanning circuit 100 to transfer the photoelectric conversion signals and the noise signals accumulated in the accumulation units 90a-90d to the output amplifier unit 110 via a horizontal signal line S and a horizontal signal line N. Each of the second switch units 80a-80d has a switch PH1N, a switch PH1S, a switch PH2N, and a switch PH2S. The switch PH1N, the switch PH1S, the switch PH2N, and the switch PH2S each include a transistor.

The selection circuit 50 supplies control signals such as a signal Vtn1, a signal Vts1, a signal Vtn2, and a signal Vts2 to the first switch units 70a-70d. The selection circuit 50 outputs control signals to control the operations of the first switch units 70a-70d.

The horizontal scanning circuit 100 supplies control signals such as a signal Vph11, a signal Vph12, a signal Vph21, a signal Vph22, a signal Vph31, a signal Vph32, a signal Vph41, and a signal Vph42 to the second switch units 80a-80d. The horizontal scanning circuit 100 outputs control signals to control the operations of the second switch units 80a-80d.

The accumulation units 90a-90d are provided corresponding to columns of the pixels 10 to accumulate (store) the photoelectric conversion signals and the noise signals output from the pixels 10. The accumulation units 90a-90d have capacitances for accumulating the photoelectric conversion signals and the noise signals. The capacitance is, for example, a capacitance formed by conductors, such as a capacitance formed by adjacent metals. Specifically, such capacitance is, for example, a capacitance formed between a conductor to which a photoelectric conversion signal or a noise signal is input and a conductor to which a predetermined potential is applied. Note that specific configuration examples of the accumulation units 90a-90d will be described later in detail with reference to FIG. 5 and FIG. 6.

In the example illustrated in FIG. 3, each of the accumulation units 90a-90d has conductors CN1 and CN2 to which noise signals are input, and conductors CS1 and CS2 to which photoelectric conversion signals are input. Additionally, each of the accumulation units 90a-90d has a fixed potential line 120 as a conductor to which the above-described predetermined potential is applied. Note that in FIG. 3, the fixed potential line 120 is indicated by a dotted line to distinguish it from the conductor CN1, the conductor CS1, the conductor CN2, and the conductor CS2.

For example, a power supply potential or a ground potential is supplied to the fixed potential terminal illustrated in FIG. 3, and the power supply potential or the ground potential is applied to the fixed potential line 120. Reference symbol C representing a plurality of capacitances illustrated in FIG. 3 schematically indicate that capacitances are respectively formed between the conductor CN1 and the fixed potential line 120, between the conductor CS1 and the fixed potential line 120, between the conductor CN2 and the fixed potential line 120, and between the conductor CS2 and the fixed potential line 120. In the present embodiment, the conductors CN1 and CN2 function as noise accumulation units for accumulating the noise signals, and the conductors CS1 and CS2 function as signal accumulation units for accumulating the photoelectric conversion signals.

The output amplifier unit 110 outputs a signal based on a difference between the noise signal input via the horizontal signal line N and the photoelectric conversion signal input via the horizontal signal line S, to an output terminal illustrated in FIG. 3. For example, the output amplifier unit 110 outputs a signal obtained by amplifying the difference between the noise signal and the photoelectric conversion signal by a predetermined gain.

Figure 4:
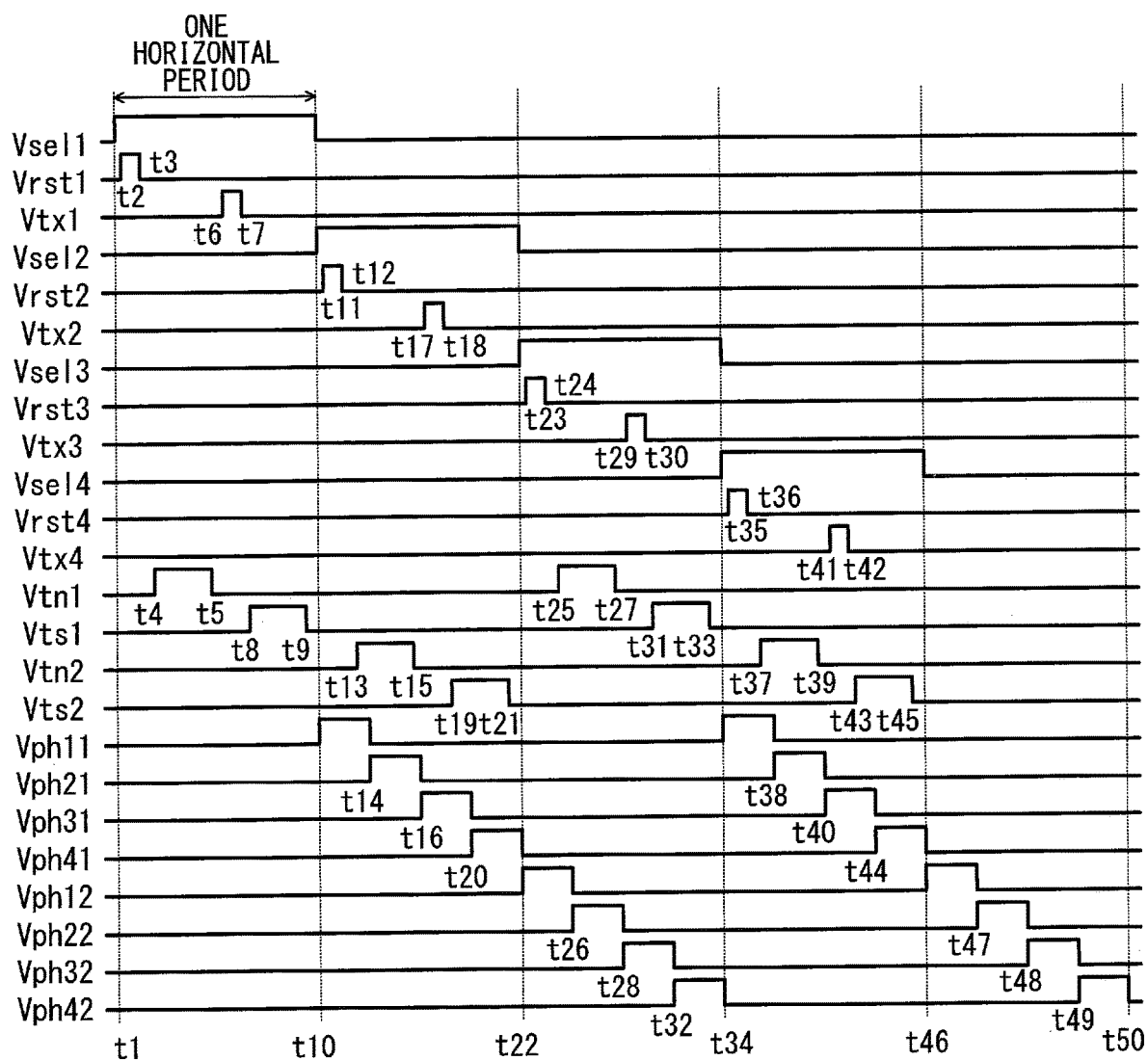
FIG. 4 is a timing chart illustrating an operation example of the image sensor according to the first embodiment.

FIG. 4 is a timing chart illustrating an operation example of the image sensor 3 according to the first embodiment. In FIG. 4, the vertical axis represents voltage levels of the control signals and the horizontal axis represents time. In the timing chart illustrated in FIG. 4, a transistor to which a control signal is inputted is turned on when a control signal is at high level (e.g., at a power supply potential), and a transistor to which a control signal is input is turned off when a control signal is at low level (e.g., at a ground potential). A period from time t1 to time t10, a period from time t10 to time t22, a period from time t22 to time t34, a period from time t34 to time t46, and a period from time t46 to time t50 each represent one horizontal period. Note that the electric charge accumulated in the photoelectric conversion unit 12 is reset in synchronization with the discharge of the electric charge of the floating diffusion 15, that is, the reset of the floating diffusion 15; however, description of the reset of the photoelectric conversion unit 12 is omitted in the following description, for simplification of explanation.

At time t1, the signal Vsel1 becomes high to turn on the transistor M4 of the selection unit 17 in each pixel 10 in the first row. At time t2, the signal Vrst1 becomes high to turn on the transistor M2 of the discharge unit 14 in each pixel 10 in the first row. As a result, the potential of the floating diffusion 15 becomes the reset potential. Additionally, the noise signals of the pixels 10 in the first row are output to the corresponding vertical signal lines 30a-30d by the amplification units 16 and the selection units 17. At time t3, the signal Vrst1 becomes low to turn off the transistor M2. At time t4, the signal Vtn1 becomes high to turn on the switch TN1 of each of the first switch units 70a-70d. As a result, the noise signals from the pixels 10 are transferred to the conductors CN1 of the corresponding accumulation units 90a-90d. The capacitances given (or added) to the conductors CN1 of the accumulation units 90a-90d accumulate the noise signals from the respective pixels 10 in the first row. At time t5, the signal Vtn1 becomes low to turn off the switch TN1. When the switch TN1 is turned off, the capacitances given to the conductors CN1 hold (accumulate) the noise signals.

At time t6, the signal Vtx1 becomes high to turn on the transistor M1 of the transfer unit 13 in each pixel 10 in the first row. This allows the electric charge photoelectrically converted by the photoelectric conversion unit 12 to be transferred to the floating diffusion 15. Additionally, the photoelectric conversion signals of the pixels 10 in the first row are output to the corresponding vertical signal lines 30a-30d by the amplification units 16 and the selection units 17. At time t7, the signal Vtx1 becomes low to turn off the transistor M1. At time t8, the signal Vts1 becomes high to turn on the switch TS1 of each of the first switch units 70a-70d. This allows the photoelectric conversion signals to be transferred to the conductors CS1 of the accumulation units 90a-90d. The capacitances given to the conductors CS1 accumulate the photoelectric conversion signals from the respective pixels 10 in the first row. At time t9, the signal Vts1 becomes low to turn off the switch TS1. When the switch TS1 is turned off, the capacitances given to the conductors CS1 hold the photoelectric conversion signals.

At time t10, signals Vph11 and Vsel2 becomes high. The signal Vph11 becomes high to turn on the switches PH1N and PH1S of the second switch unit 80a. As a result, the signals from the pixels 10 in the first row accumulated in the accumulation unit 90a corresponding to the first column of the pixels 10 are output to the horizontal signal line S and the horizontal signal line N. In other words, the photoelectric conversion signal accumulated in the conductor CS1 of the accumulation unit 90a is output to the horizontal signal line S, and the noise signal accumulated in the conductor CN1 of the accumulation unit 90a is output to the horizontal signal line N. The output amplifier unit 110 outputs a signal based on a difference between the noise signal and the photoelectric conversion signal.

Additionally, at time t10, the signal Vsel2 becomes high to turn on the transistor M4 of each pixel 10 in the second row. At time t11, the signal Vrst2 becomes high to turn on the transistor M2 and reset the floating diffusion 15. Additionally, the noise signal of each pixel 10 in the second row is output to each of the vertical signal lines 30a-30d. At time t12, the signal Vrst2 becomes low to turn off the transistor M2. At time t13, the signal Vtn2 becomes high to turn on the switch TN2. As a result, the noise signals are transferred to the conductors CN2 of the corresponding accumulation units 90a-90d. The capacitances given to the conductors CN2 accumulate the noise signals from the respective pixels 10 in the second row.

At time t14, the signal Vph11 becomes low and the signal Vph21 becomes high. The signal Vph11 becomes low to turn off the switch PH1N and the switch PH1S of the second switch unit 80a. The signal Vph21 becomes high to turn on the switches PH1N and PH1S of the second switch unit 80b. As a result, the photoelectric conversion signal from the pixel 10 in the first row accumulated in the accumulation unit 90b corresponding to the second column of the pixels 10 is output to the horizontal signal line S, and the noise signal is output to the horizontal signal line N. The output amplifier unit 110 outputs a signal based on a difference between the noise signal and the photoelectric conversion signal.

At time t15, the signal Vtn2 becomes low to turn off the switch TN2. When the switch TN2 is turned off, the capacitances given to the conductors CN2 hold the noise signals.

At time t16, the signal Vph21 becomes low and the signal Vph31 becomes high. The signal Vph21 becomes low to turn off the switch PH1N and the switch PH1S of the second switch unit 80b. The signal Vph31 becomes high to turn on the switches PH1N and PH1S of the second switch unit 80c. As a result, the photoelectric conversion signal from the pixel 10 in the first row accumulated in the accumulation unit 90c corresponding to the third column of the pixels 10 is output to the horizontal signal line S, and the noise signal is output to the horizontal signal line N. The output amplifier unit 110 outputs a signal based on a difference between the noise signal and the photoelectric conversion signal.

At time t17, the signal Vtx2 becomes high to turn on the transistor M1 in each pixel 10 in the second row. This allows the electric charge photoelectrically converted by the photoelectric conversion unit 12 to be transferred to the floating diffusion 15. Additionally, the photoelectric conversion signals of the pixels 10 in the second row are output to the corresponding vertical signal lines 30a-30d. At time t18, the signal Vtx2 becomes low to turn off the transistor M1. At time t19, the signal Vts2 becomes high to turn on the switch TS2 of each of the first switch units 70a-70d. This allows the photoelectric conversion signals to be transferred to the conductors CS2 of the accumulation units 90a-90d. The capacitances given to the conductors CS2 accumulate the photoelectric conversion signals from the respective pixels 10 in the second row.

At time t20, the signal Vph31 becomes low and the signal Vph41 becomes high. The signal Vph31 becomes low to turn off the switch PH1N and the switch PH1S of the second switch unit 80c. The signal Vph41 becomes high to turn on the switch PH1N and the switch PH1S of the second switch unit 80d. As a result, the photoelectric conversion signal from the pixel 10 in the first row accumulated in the accumulation unit 90d corresponding to the fourth column of the pixels 10 is output to the horizontal signal line S, and the noise signal is output to the horizontal signal line N. The output amplifier unit 110 outputs a signal based on a difference between the noise signal and the photoelectric conversion signal.

At time t21, the signal Vts2 becomes low to turn off the switch TS2. When the switch TS2 is turned off, the capacitances given to the conductors CS2 hold the photoelectric conversion signals.

As described above, in a period from time t10 to time t22, a horizontal transfer is performed in which the signals are read out from the pixels 10 in the second row to the accumulation units 90, while the signals from the pixels 10 in the first row accumulated in the accumulation units 90 are output to the horizontal signal line S and the horizontal signal line N.

At time t22, the signal Vph41 becomes low, and the signal Vph12 and the signal Vsel2 becomes high. The signal Vph41 becomes low to turn off the switch PH1N and the switch PH1S of the second switch unit 80d. The signal Vph12 becomes high to turn on the switch PH2N and the switch PH2S of the second switch unit 80a. As a result, the signals from the pixels 10 in the second row accumulated in the accumulation unit 90a corresponding to the first column of the pixels 10 are output to the horizontal signal line S and the horizontal signal line N. In other words, the photoelectric conversion signal accumulated in the conductor CS2 of the accumulation unit 90a is output to the horizontal signal line S, and the noise signal accumulated in the conductor CN2 of the accumulation unit 90a is output to the horizontal signal line N. The output amplifier unit 110 outputs a signal based on a difference between the noise signal and the photoelectric conversion signal.

At time t22, the signal Vsel3 becomes high to turn on the transistor M4 in each pixel 10 in the third row. At time t23, the signal Vrst3 becomes high to turn on the transistor M2 and reset the floating diffusion 15. Additionally, the noise signals of the pixels 10 in the third row are output to the corresponding vertical signal lines 30a-30d. At time t24, the signal Vrst3 becomes low to turn off the transistor M2. At time t25, the signal Vtn1 becomes high to turn on the switch TN1. As a result, the noise signals are transferred to the conductors CN1 of the corresponding accumulation units 90a-90d. The capacitances given to the conductors CN1 accumulate the noise signals from the respective pixels 10 in the third row.

At time t26, the signal Vph12 becomes low and the signal Vph22 becomes high. The signal Vph12 becomes low to turn off the switch PH2N and the switch PH2S of the second switch unit 80a. The signal Vph22 becomes high to turn on the switch PH2N and the switch PH2S of the second switch unit 80b. As a result, the photoelectric conversion signal from the pixel 10 in the second row accumulated in the accumulation unit 90b corresponding to the second column of the pixels 10 is output to the horizontal signal line S, and the noise signal is output to the horizontal signal line N. The output amplifier unit 110 outputs a signal based on a difference between the noise signal and the photoelectric conversion signal.

At time t27, the signal Vtn1 becomes low to turn off the switch TN1. When the switch TN1 is turned off, the capacitances given to the conductors CN1 hold the noise signals.

At time t28, the signal Vph22 becomes low and the signal Vph32 becomes high. The signal Vph22 becomes low to turn off the switch PH2N and the switch PH2S of the second switch unit 80b. The signal Vph32 becomes high to turn on the switch PH2N and the switch PH2S of the second switch unit 80c. As a result, the photoelectric conversion signal from the pixel 10 in the second row accumulated in the accumulation unit 90c corresponding to the third column of the pixels 10 is output to the horizontal signal line S, and the noise signal is output to the horizontal signal line N. The output amplifier unit 110 outputs a signal based on a difference between the noise signal and the photoelectric conversion signal.

At time t29, the signal Vtx3 becomes high to turn on the transistor M1 in each pixel 10 in the third row. This allows the electric charge photoelectrically converted by the photoelectric conversion unit 12 to be transferred to the floating diffusion 15. Additionally, the photoelectric conversion signals of the pixels 10 in the third row are output to the corresponding vertical signal lines 30a-30d. At time t30, the signal Vtx3 becomes low to turn off the transistor M1. At time t31, the signal Vts1 becomes high to turn on the switch TS1 of each of the first switch units 70a-70d. This allows the photoelectric conversion signals to be transferred to the conductors CS1 of the accumulation units 90a-90d. The capacitances given to the conductors CS1 accumulate the photoelectric conversion signals from the respective pixels 10 in the third row.

At time t32, the signal Vph32 becomes low and the signal Vph42 becomes high. The signal Vph32 becomes low to turn off the switch PH2N and the switch PH2S of the second switch unit 80c. The signal Vph42 becomes high to turn on the switch PH2N and the switch PH2S of the second switch unit 80d. As a result, the photoelectric conversion signal from the pixel 10 in the second row accumulated in the accumulation unit 90d corresponding to the fourth column of the pixels 10 is output to the horizontal signal line S, and the noise signal is output to the horizontal signal line N. The output amplifier unit 110 outputs a signal based on a difference between the noise signal and the photoelectric conversion signal.

At time t33, the signal Vts1 becomes low to turn off the switch TS1. When the switch TS1 is turned off, the capacitances given to the conductors CS1 hold the photoelectric conversion signals.

In a period from time t34 to time t46, the transistors controlled by the signals Vsel4, Vrst4, Vtn2, Vtx4, Vts2 are sequentially turned on and off in the same manner as in the period from time t10 to time 22 and the period from time t22 to time 34. As a result, the noise signals from the pixels 10 in the fourth row are accumulated in the capacitances given to the conductors CN2, and the photoelectric conversion signals from the pixels 10 in the fourth row are accumulated in the capacitances given to the conductors CS2. Furthermore, in a period from time t34 to time t46, the transistors controlled by the signals Vph11, Vph21, Vph31, Vph41 are sequentially turned on and off. As a result, the noise signals and the photoelectric conversion signals from the pixels 10 in the third row accumulated in the respective accumulation units 90a-90d are sequentially output. The output amplifier unit 110 sequentially outputs signals based on differences between the noise signals and the photoelectric conversion signals output from the accumulation units 90a-90d.

In a period from time t46 to time t50, the transistors controlled by the signals Vph12, Vph22, Vph32, Vph42 are sequentially turned on and off. As a result, the noise signals and the photoelectric conversion signals from the pixels 10 in the fourth row accumulated in the respective accumulation units 90a-90d are sequentially output. The output amplifier unit 110 sequentially outputs signals based on differences between the noise signals and the photoelectric conversion signals output from the accumulation units 90a-90d.

As described above, in the present embodiment, while signals are read out from pixels 10 in a row to the accumulation units 90, a horizontal transfer is performed in which signals from pixels 10 in another row accumulated in the accumulation units 90 are output to the horizontal signal line S and the horizontal signal line N. The readout time from all the pixels 10 can be reduced by performing the horizontal transfer operation in parallel during the readout period from the pixel 10. Reducing the readout time can achieve a readout at a high frame rate.

Figure 5:
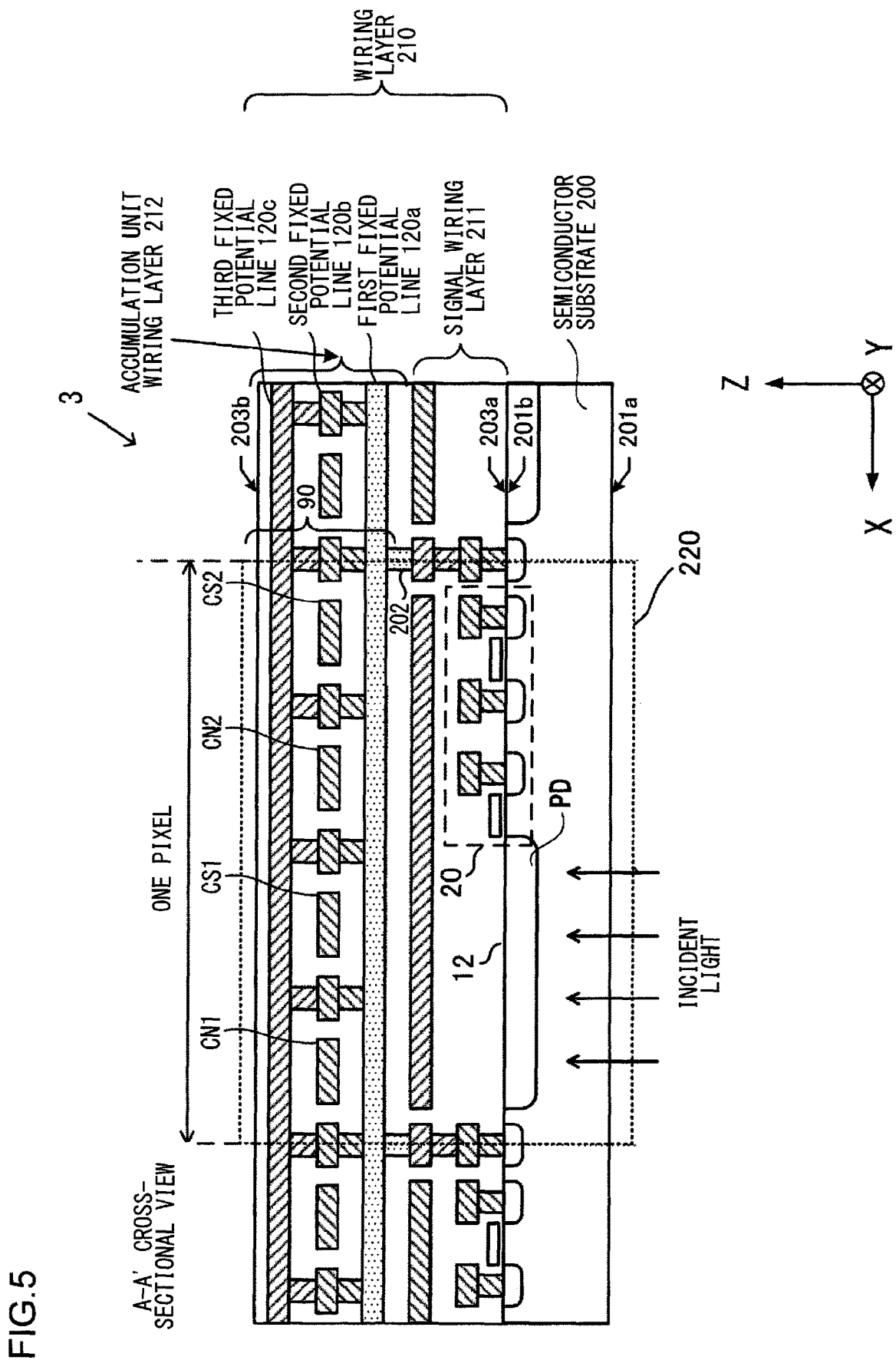
FIG. 5 is a view illustrating an example of a cross-sectional structure of the image sensor according to the first embodiment.

FIG. 5 is a view illustrating an example of a cross-sectional structure of the image sensor 3 according to the first embodiment. FIG. 5 is a cross-sectional view taken along a line A-A' in FIG. 6 (described later). The image sensor 3 is, for example, a back side illumination type image sensor. As illustrated in FIG. 5, incident light is mainly incident in the Z-axis plus direction. Further, as illustrated in the coordinate axes, the leftward direction of the paper sheet orthogonal to the Z-axis is the X-axis plus direction, and the depth direction of the paper sheet orthogonal to the Z-axis and the X-axis is the Y-axis plus direction. In some subsequent figures, coordinate axes are illustrated so that the orientation of each figure can be understood with reference to the coordinate axes of FIG. 5.

The image sensor 3 is configured to include a semiconductor substrate 200 made of a semiconductor material such as silicon and a wiring layer 210 stacked on the semiconductor substrate 200. The image sensor 3 further has a microlens layer, a color filter layer, and a passivation layer, which are not illustrated. In the image sensor 3, the microlens layer, the color filter layer, the passivation layer, the semiconductor substrate 200, and the wiring layer 210 are arranged in this order in the Z-axis plus direction, for example.

The semiconductor substrate 200 has a first surface 201a, and a second surface 201b that is different from the first surface 201a. The first surface 201a is to be an incident surface on which light is incident. The second surface 201b is opposite to the first surface 201a. In the present embodiment, a "back side" of the image sensor 3 represents the first surface 201a located on a side opposite to the wiring layer 210, and the "back side illumination type" is a configuration in which light is incident from the first surface 201a, which is the back side. The wiring layer 210 has a surface (a third surface 203a) on the second surface 201b side of the semiconductor substrate 200 and a surface (a fourth surface 203b) opposite to the third surface 203a.

The semiconductor substrate 200 has the photoelectric conversion unit 12 and the readout unit 20 between the first surface 201a and the second surface 201b. A plurality of pixels 10 each having the photoelectric conversion unit 12 and the readout unit 20 are arranged in the X-axis direction and the Y-axis direction. The photoelectric conversion unit 12 converts incident light into an electric charge, the incident light being incident from one side of the semiconductor substrate 200, that is, from the first surface 201a side of the semiconductor substrate 200. The accumulation unit 90 is provided to be stacked on the photoelectric conversion unit 12 on a side opposite to the one side of the semiconductor substrate 200, that is, on the second surface 201b side of the semiconductor substrate 200. In other words, the accumulation unit 90 is provided between the photoelectric conversion unit 12 and the fourth surface 203b of the wiring layer 210.

On the second surface 201b of the semiconductor substrate 200, a multilayer wiring layer 210 including conductor films (metal films) and insulating films is formed. The wiring layer 210 has a plurality of wirings, vias, and the like arranged therein. The conductor films are made of copper, aluminum, or the like. The insulating films include an insulating film between the conductor films, a gate insulating film, and the like, and is made of an oxide film, a nitride film, and the like.

The wiring layer 210 has a signal wiring layer 211 provided with signal lines for control signals Vtxn, Vrstn, Vseln, or the like input to each pixel 10 and the vertical signal lines 30, and an accumulation unit wiring layer 212 constituting the accumulation units 90 (accumulation units 90a-90d). The signal wiring layer 211 is stacked on the second surface 201b of the semiconductor substrate 200, and the accumulation unit wiring layer 212 is stacked on the signal wiring layer 211a.

In the accumulation unit wiring layer 212, the accumulation unit 90a corresponding to the first pixel column is stacked via the signal wiring layer 211 in a pixel region in which the first pixel column is located, the accumulation unit 90b corresponding to the second pixel column is stacked via the signal wiring layer 211 in a pixel region in which the second pixel column is located, the accumulation unit 90c corresponding to the third pixel column is stacked via the signal wiring layer 211, the accumulation unit 90d corresponding to the fourth pixel column is stacked via the signal wiring layer 211, and so forth, as illustrated in FIG. 3 and FIG. 5. In this way, each of the accumulation units 90a-90d of the accumulation unit wiring layer 212 is provided in each pixel region 220 for each corresponding pixel column. The size of each of the accumulation units 90a-90d of the accumulation unit wiring layer 212 corresponds to the size of one column of the pixels 10. The accumulation units 90a-90d of the accumulation unit wiring layer 212 have the same configuration, and the accumulation unit 90 illustrated in FIG. 5 thus corresponds to any one of the accumulation units 90a-90d.

As described above, the accumulation unit 90 has the conductor CN1, the conductor CS1, the conductor CN2, the conductor CS2, and the fixed potential line 120. As illustrated in FIG. 5, for example, the fixed potential line 120 has a first fixed potential line 120a, a second fixed potential line 120b, and a third fixed potential line 120c, which are formed by conductor films in different layers. The first fixed potential line 120a and the third fixed potential line 120c are arranged apart from each other in the Z-axis direction, which is the stacking direction of the wiring layer 210. The first fixed potential line 120a and the third fixed potential line 120c are common to all the accumulation units 90a, 90b, 90c, 90d, and accordingly are formed so as to cover all the pixels 10 of the image sensor 3. The first fixed potential line 120a and the third fixed potential line 120c may be common to all the accumulation units as described above, or may be configured for each accumulation unit.

The conductors CN1, CS1, CN2, and CS2 extend in a direction in which a plurality of pixels 10 constituting each pixel column are arranged. The conductors CN1, CS1, CN2, CS2 are arranged away from the first fixed potential line 120a and the third fixed potential line 120c between the first fixed potential line 120a and the third fixed potential line 120c. The second fixed potential line 120b is arranged between the conductors CN1, CS1, CN2, CS2, and is connected to the first fixed potential line 120a and the third fixed potential line 120c through vias. Insulating films are provided between the conductors CN1, CS1, CN2, CS2 and the first to third fixed potential lines 120a-120c. The insulating films may be oxide films or nitride films. Specifically, the insulating films are silicon oxide films, silicon nitride films, silicon oxynitride films, or multilayer films composed of these films.

In the accumulation unit 90, capacitances are formed between each of the conductors CN1, CS1, CN2, CS2 and the first to third fixed potential lines 120a-120c. The capacitance can be increased by reducing distances between each of the conductors CN1, CS1, CN2, CS2 and the first to third fixed potential lines 120a-120c. A high dielectric constant material having a dielectric constant higher than that of a silicon oxide film or the like may be used in order to increase the capacitance. MIM capacitors may also be used. Note that capacitances are also given to conductors CN1, CS1, CN2, CS2, which are formed between the conductors CN1, CS1, CN2, CS2 and wirings or the like different from the fixed potential lines.

A predetermined potential such as the power supply potential or the ground potential is applied to the first fixed potential line 120a, the second fixed potential line 120b, and the third fixed potential line 120c. The first fixed potential line 120a functions as a shield between the vertical signal lines 30, the control signal lines, or the like of the signal wiring layer 211 and the conductors CN1, CS1, CN2, CS2. Providing the first fixed potential line 120a can reduce formation of a large parasitic capacitance between the vertical signal lines 30, the control signal lines, or the like and the conductors CN1, CS1, CN2, CS2. Additionally, crosstalks between the vertical signal lines 30, the control signal lines, or the like and the conductors CN1, CS1, CN2, CS2 can be reduced. Furthermore, the first fixed potential line 120a, the second fixed potential line 120b, and the third fixed potential line 120c are provided so as to surround four sides of each of the conductors CN1, CS1, CN2, CS2 to function as shields between the conductors CN1, CS1, CN2, CS2. The formation of a large parasitic capacitance between the conductors CN1, CS1, CN2, CS2 may be avoided and crosstalks between the conductors CN1, CS1, CN2, CS2 may be reduced.

In the example illustrated in FIG. 5, the first fixed potential line 120a is set to the ground potential, and is connected to the semiconductor substrate 200 through a via 202 and the like. In other words, the first fixed potential line 120a is commonly connected to each pixel 10 as a ground line for supplying the ground potential to each pixel 10. Note that a power supply potential may be applied to the first fixed potential line 120a to use it as a power supply line common to the pixels 10. Thus, the fixed potential lines are shared by: conductors for forming the capacitances formed by the conductors CN1, CS1, CN2, CS2; a shield for reducing noise contamination; and power supply lines or ground lines of the pixels 10. Using the fixed potential lines as the power supply line or the ground line for each pixel 10 eliminates the need for separately providing any wiring for the power supply line or the ground line. Therefore, the number of wiring layers 210 can be reduced.

Figure 6:
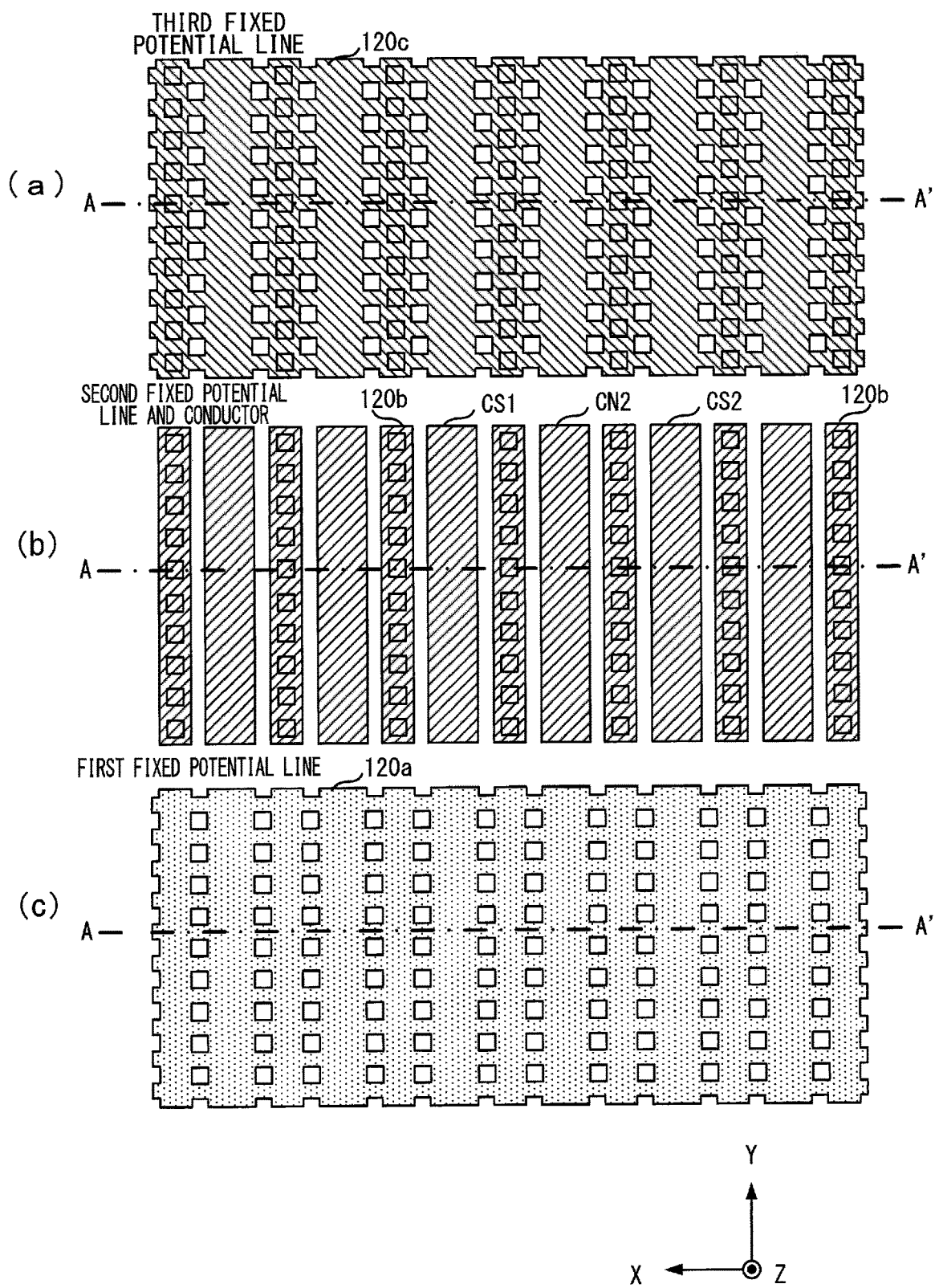
FIG. 6 is a view illustrating a planar layout example of a part of the accumulation unit wiring layer of the image sensor according to the first embodiment.

FIG. 6 is a view illustrating a planar layout example of a part of the accumulation unit wiring layer 212 of the image sensor 3 according to the first embodiment. FIG. 6(a) is a view illustrating an example of a planar layout of a layer in which the third fixed potential line 120c is formed, FIG. 6(b) is a view illustrating an example of a planar layout of a layer in which the second fixed potential line 120b and the conductors CN1, CS1, CN2, CS2 are formed, and FIG. 6(c) is a view illustrating an example of a planar layout of a layer in which the first fixed potential line 120a is formed.

As described above, the third fixed potential line 120c and the first fixed potential line 120a are formed in planar shapes as illustrated in FIG. 6. The third fixed potential line 120c and the first fixed potential line 120a are formed to cover all the pixels 10 arranged two-dimensionally in a matrix, for example. The second fixed potential line 120b, the conductor CN1, the conductor CS1, the conductor CN2, and the conductor CS2 are each linearly formed. The second fixed potential line 120b is arranged facing to the conductors CN1, CS1, CN2, CS2. The length of the second fixed potential line 120b in the Y-axis direction is a length corresponding to the lengths of the conductors CN1, CS1, CN2, CS2 in the Y-axis direction. In the present embodiment, since the accumulation units 90a-90d are provided corresponding to the pixel rows of the pixels 10, the lengths in the Y-axis direction of the second fixed potential line 120b and the conductors CN1, CS1, CN2, CS2 correspond to the length of one pixel column. The third fixed potential line 120c and the second fixed potential line 120b are connected through a plurality of vias, and the second fixed potential line 120b and the first fixed potential line 120a are connected through a plurality of vias.

According to the above-described embodiment, the following operations and effects can be obtained.

(1) An image sensor 3 includes: a plurality of pixels 10 each having a photoelectric conversion unit 12 that converts incident light into an electric charge, the incident light being incident from one side of a substrate 200, and an output unit (an amplification unit 16 and a selection unit 17) that outputs a signal caused by the electric charge, the plurality of pixels 10 being arranged in a first direction and a second direction intersecting the first direction; and an accumulation unit 90 provided to be stacked on the photoelectric conversion unit 12 on a side opposite to one side of the substrate 200, the accumulation unit 90 accumulating the signal. In the present embodiment, the accumulation unit 90 is provided to be stacked on the second surface 200b of the semiconductor substrate 200 in the pixel region 220. In the prior art, a large number of capacitances are provided in a region around the pixel region 220 where an analog/digital conversion circuit and the like are disposed. This leads to an increase in the chip area of the image sensor. In contrast, in the present embodiment, the accumulation unit 90 is provided to be stacked on the second surface 201b of the semiconductor substrate 200. Thus, an increase in the chip area can be reduced. Additionally, providing the accumulation unit 90 in the pixel region 220 can avoid an increase in the area of the region around the pixel region 220 where the analog/digital conversion circuit and the like are disposed. Furthermore, a large capacitance can be formed by providing capacitances corresponding to one pixel column, for example.

(2) An image sensor 3 includes a photoelectric conversion unit 12 that converts light incident on a first surface 201a of a semiconductor substrate 200 into an electric charge; a readout unit 20 that outputs a signal caused by the electric charge to a second surface 201b of the semiconductor substrate 200; and an accumulation unit 90 that accumulates the signal output by the readout unit 20, the accumulation unit 90 being provided to be stacked on the pixel region 220 of the second surface 201b. In this way, an increase in the chip area can be reduced.

(3) The accumulation unit 90 is commonly connected to the plurality of pixels 10 arranged in the first direction. In this way, capacitances can be provided corresponding to one pixel column, for example.

(4) The image sensor 3 further includes a signal line (a vertical signal line 30) which is commonly connected to the plurality of pixels 10 arranged in the first direction and to which a signal is output by the readout unit 20. The accumulation unit 90 is commonly connected to the plurality of pixels 10 via the signal line. In this way, the signal from each pixel 10 read out via the vertical signal line 30 can be accumulated in the accumulation unit 90.

(5) The readout unit 20 outputs a signal caused by the electric charge, and a noise signal. The accumulation unit 90 includes a signal accumulation unit that accumulates the signal caused by the electric charge and a noise accumulation unit that accumulates the noise signal. In this way, the photoelectric conversion signal and the noise signal output from the readout unit 20 can be separately accumulated in the accumulation unit 90.

(6) The image sensor includes a first wiring (a second fixed potential line 120b) which is provided between the signal accumulation unit and the noise accumulation unit and to which a constant potential (for example, a power supply potential or a ground potential) is applied; a second wiring (a first fixed potential line 120a) which is provided between the readout unit 20 and the accumulation unit 90 and to which a constant potential is applied; and a third wiring (a third fixed potential line 120c) which is provided on a side opposite to the side on which light is incident, via the accumulation unit 90 and the insulating film and to which a constant potential is applied. In the present embodiment, the first fixed potential line 120a, the second fixed potential line 120b, and the third fixed potential line 120c are provided so as to surround four sides of each of the conductors CN1, CS1, CN2, CS2. Thus, a noise contamination can be reduced.

(7) The accumulation unit 90 includes a first accumulation unit (for example, an accumulation unit 90a) connected to a first plurality of pixels 10 arranged in the first direction, and a second accumulation unit (for example, an accumulation unit 90b) connected to a second plurality of pixels arranged in the first direction, the second plurality of pixels being different from the first plurality of pixels 10. A plurality of the first accumulation units and the second accumulation units are arranged side by side in a second direction. In this way, an accumulation unit can be provided for each pixel column, for example, to obtain a large capacitance.

(8) The readout unit 90 includes: the holding unit 15 that holds the electric charge converted by the photoelectric conversion unit 12; the transfer unit 13 that transfers the electric charge to the holding unit 15; the discharge unit 14 that discharges the electric charge held in the holding unit 15; and an amplification unit 16 that amplifies the signal caused by the electric charge transferred by the transfer unit 13. In this way, the photoelectric conversion signal based on the electric charge photoelectrically converted by the photoelectric conversion unit 12 can be read out from each pixel 10.

(9) The noise signal is a signal when the electric charge held in the holding unit 15 has been discharged. In this way, a noise signal serving as a reference level for the photoelectric conversion signal can be obtained.

(10) An image sensor 3 includes: a first layer (a semiconductor substrate 200) having a photoelectric conversion unit 12 that converts light incident on a first surface 201a of a semiconductor substrate 200 into an electric charge, and a readout unit 20 that outputs a signal caused by the electric charge to a second surface 201b of the semiconductor substrate 200; and a second layer (an accumulation wiring layer 212) having an accumulation unit 90 that accumulates the signal output by the readout unit 20. In this way, a large capacitance value can be obtained without increasing the chip area.

(11) The accumulation unit 90 has a capacitance caused by a conductor. In this way, an increase in the chip area can be reduced as compared with a case where a diffusion capacitance is provided.

(12) An image sensor 3 includes a plurality of pixels 10 having a photoelectric conversion unit 12 that converts incident light to an electric charge, a first accumulation unit (a floating diffusion 15) to which the electric charge photoelectrically converted by the photoelectric conversion unit 12 is transferred, and an output unit (an amplification unit 16 and a selection unit 17) that outputs a signal caused by the electric charge transferred to the first accumulation unit; an output control unit (a vertical scanning circuit 40) that switches a pixel signal (a photoelectric conversion signal) caused by the electric charge transferred from the photoelectric conversion unit 12 to the first accumulation unit and a reset signal (a noise signal) in which the electric charge in the first accumulation unit is reset, to output the pixel signal or the noise signal from the output unit; a second accumulation unit (a signal accumulation unit) that accumulates the pixel signal output from the output unit; and a third accumulation unit (a noise accumulation unit) that accumulates the reset signal output from the output unit. The pixel 10 is arranged between the surface on which light is incident and the second accumulation unit or the third accumulation unit. In this way, an increase in the chip area can be reduced. Additionally, a large capacitance value can be obtained without increasing the chip area.

Second Embodiment

An image-capturing apparatus according to a second embodiment has the same configuration as that of the image-capturing apparatus 1 according to the first embodiment. The image sensor according to the second embodiment is different from the first embodiment mainly in that a plurality of vertical signal lines are provided for each pixel column to simultaneously read out pixels 10 in a plurality of rows. Note that parts similar to or equivalent to that in the first embodiment are denoted by the same reference numbers in the figures, and differences between the first and second embodiments will mainly be described.

Figure 7:
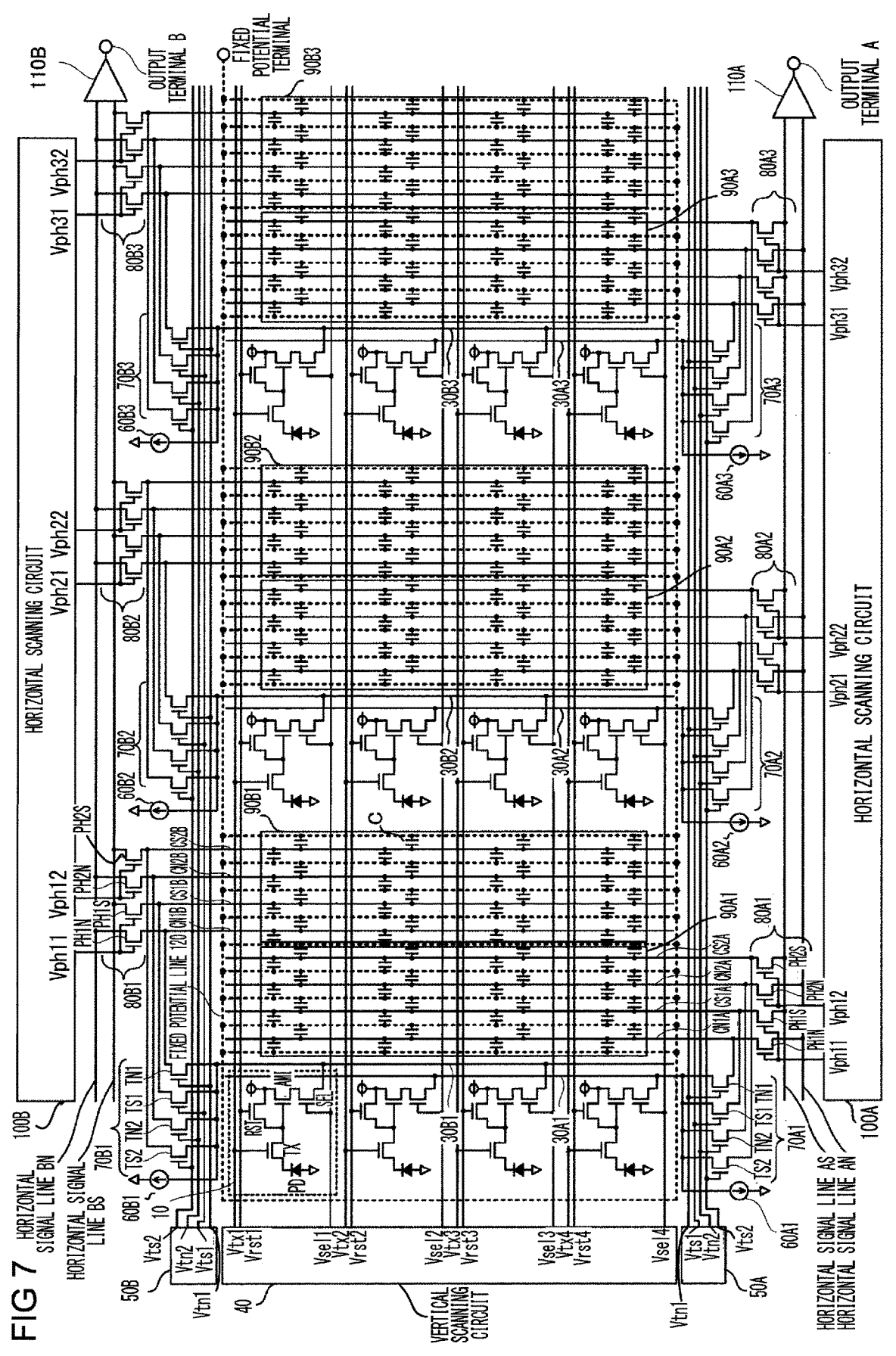

FIG. 7 is a circuit diagram illustrating a configuration of a part of an image sensor 3 according to the second embodiment. In the second embodiment, two vertical signal lines (vertical signal lines 30A and 30B) are provided corresponding to each column of the pixels 10. The pixels 10 in each column are connected to different vertical signal lines for each row. In the second embodiment, the image sensor 3 includes selection circuits 50 (selection circuits 50A and 50B), electric current sources 60 (electric current sources 60A1-60A3, electric current sources 60B1-60B3), first switch units 70 (first switch units 70A1-70A3, first switch units 70B1-70B3), second switch units 80 (second switch units 80A1-80A3, second switch units 80B1-80B3), accumulation units 90 (accumulation units 90A1-90A3, accumulation units 90B1-90B3), horizontal scanning circuits 100 (horizontal scanning circuits 100A and 100B), and output amplifier units 110 (output amplifier units 110A and 110B). Note that the example in FIG. 7 illustrates only three pixels 10 in the horizontal direction and four pixels 10 in the vertical direction, for simplification of explanation.

Figure 8:
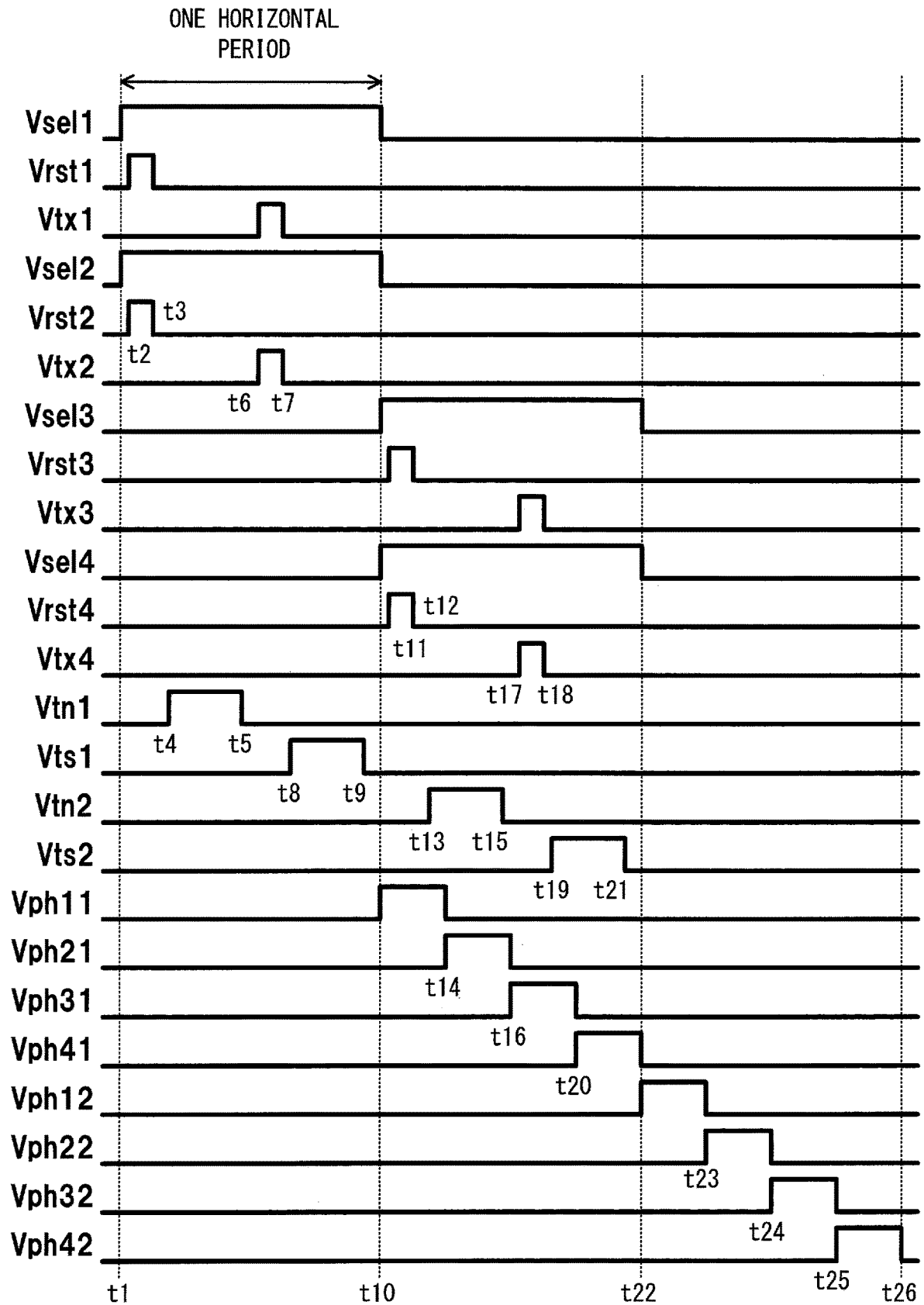
FIG. 8 is a timing chart illustrating an operation example of the image sensor according to the second embodiment.

FIG. 8 is a timing chart illustrating an operation example of the image sensor 3 according to the second embodiment. In FIG. 8, a period from time t1 to time t10, a period from time t10 to time t22, and a period from time t22 to time t26 each represent one horizontal period.

At time t1, the signals Vsel1 and Vsel2 become high to turn on the transistor M4 of the selection unit 17 in each pixel 10 in the first and second rows. At time t2, the signals Vrst1 and Vrst2 become high to turn on the transistor M2 of the discharge unit 14 in each pixel 10 in the first and second rows, and the potential of the floating diffusion 15 becomes the reset potential. Additionally, the noise signals of the pixels 10 in the first row are output to the corresponding vertical signal lines 30B1-30B3 and the noise signals of the pixels 10 in the second row are output to the corresponding vertical signal lines 30A1-30A3.

At time t3, the signals Vrst1 and Vrst2 become low to turn off the transistor M2. At time t4, the signal Vtn1 becomes high to turn on the switch TN1 of each of the first switch units 70A1-70A3 and the first switch units 70B1-70B3. As a result, the noise signals from the pixels 10 in the first row are transferred to the conductors CN1 of the corresponding accumulation units 90B1-90B3, and the noise signals from the pixels 10 in the second row are transferred to conductors CN1A of the corresponding accumulation units 90A1-90A3. At time t5, the signal Vtn1 becomes low to turn off the switch TN1. When the switch TN1 is turned off, capacitances given to conductors CN1B of the accumulation units 90B1-90B3 hold the noise signals from the respective pixels 10 in the first row. Additionally, capacitances given to the conductors CN1A of the accumulation units 90A1-90A3 hold the noise signals from the respective pixels 10 in the second row.

At time t6, the signal Vtx1 the signal Vtx2 become high to turn on the transistor M1 of the transfer unit 13 in each pixel 10 in the first and second row, and the electric charge photoelectrically converted by the photoelectric conversion unit 12 is transferred to the floating diffusion 15. Additionally, the photoelectric conversion signals of the pixels 10 in the first row are output to the corresponding vertical signal lines 30B1-30B3, and the photoelectric conversion signals of the pixels 10 in the second row are output to the corresponding vertical signal lines 30A1-30A3. At time t7, the signals Vtx1 and Vtx2 become low to turn off the transistor M1.

At time t8, the signal Vts1 becomes high to turn on the switches TS1 of the first switch units 70A1-70A3 and the first switch units 70B1-70B3. This allows the photoelectric conversion signals from the pixels 10 in the first row to be transferred to the conductors CS1B of the accumulation units 90B1-90B3 and allows the photoelectric conversion signals from the pixels 10 in the second row to be transferred to the conductors CS1A of the accumulation units 90A1-90A3. At time t9, the signal Vts1 becomes low to turn off the switch TS1. When the switch TS1 is turned off, the capacitances given to the conductors CS1B of the accumulation units 90B1-90B3 hold the photoelectric conversion signals from the respective pixels 10 in the first row. Additionally, the capacitances given to the conductors CS1A of the accumulation units 90A1-90A3 hold the photoelectric conversion signals from the respective pixels 10 in the second row.

As described above, in a period from time t1 to time t10, the signals of the pixels 10 in the first row are read out to the accumulation units 90B1-90B3, and the signals of the pixels 10 in the second row are read out to the accumulation unit 90A1-90A3.

In a period from time t10 to time t22, the transistors controlled by the signals Vsel3, Vsel4, Vrst3, Vrst4, Vtn2, Vtx3, Vtx4, Vts2 are sequentially turned on and off in the same manner as in the period from time t1 to time 10. This allows the capacitances given to the conductors CN2B and CS2B of the accumulation units 90B1-90B3 to accumulate the noise signals and the photoelectric conversion signals from the respective pixels 10 in the third row. This also allows the capacitances given to the conductors CN2A and CS2A of the accumulation units 90A1-90A3 to accumulate the noise signals and the photoelectric conversion signals from the respective pixels 10 in the fourth row. Thus, in the present embodiment, the conductors CN1A, CN2A, CN1B, and CN2B function as noise accumulation units for accumulating the noise signals. Additionally, the conductors CS1A, CS2A, CS1B, and CS2B function as signal accumulation units for accumulating the photoelectric conversion signals.

Furthermore, at time t10, the signal Vph11 becomes high to turn on the switches PH1N and PH1S of the second switch units 80A1 and 80B1. As a result, the signals from the pixels 10 in the first row accumulated in the accumulation unit 90B1 are output to the horizontal signal line BS and the horizontal signal line BN. Furthermore, the signals from the pixels 10 in the second row accumulated in the accumulation unit 90A1 are output to the horizontal signal line AS and the horizontal signal line AN. Each of the output amplifier unit 110A and the output amplifier unit 110B outputs a signal based on a difference between the noise signal and the photoelectric conversion signal.

At time t14, the signal Vph21 becomes high to turn on the switches PH1N and PH1S of the second switch units 80A2 and 80B2. As a result, the signals from the pixels 10 in the first row accumulated in the accumulation unit 90B2 are horizontally transferred, and the signals from the pixels 10 in the second row accumulated in the accumulation unit 90A2 are horizontally transferred. At time t16, the signal Vph31 becomes high to turn on the switches PH1N and PH1S of the second switch units 80A3 and 80B3. As a result, the signals from the pixels 10 in the first row accumulated in the accumulation unit 90B3 are horizontally transferred, and the signals from the pixels 10 in the second row accumulated in the accumulation unit 90A3 are horizontally transferred.

In a period from time t22 to time t25, the transistors controlled by the signals Vph12, Vph22, Vph32 are sequentially turned on and off. As a result, the noise signals and the photoelectric conversion signals from the pixels 10 in the third row accumulated in the respective accumulation units 90B1-90B3 are sequentially output. Furthermore, the noise signals and the photoelectric conversion signals from the pixels 10 in the fourth row accumulated in the respective accumulation units 90A1-90A3 are sequentially output. The output amplifier units 110A and 110B sequentially output signals based on differences between the noise signals and the photoelectric conversion signals.

Figure 9:
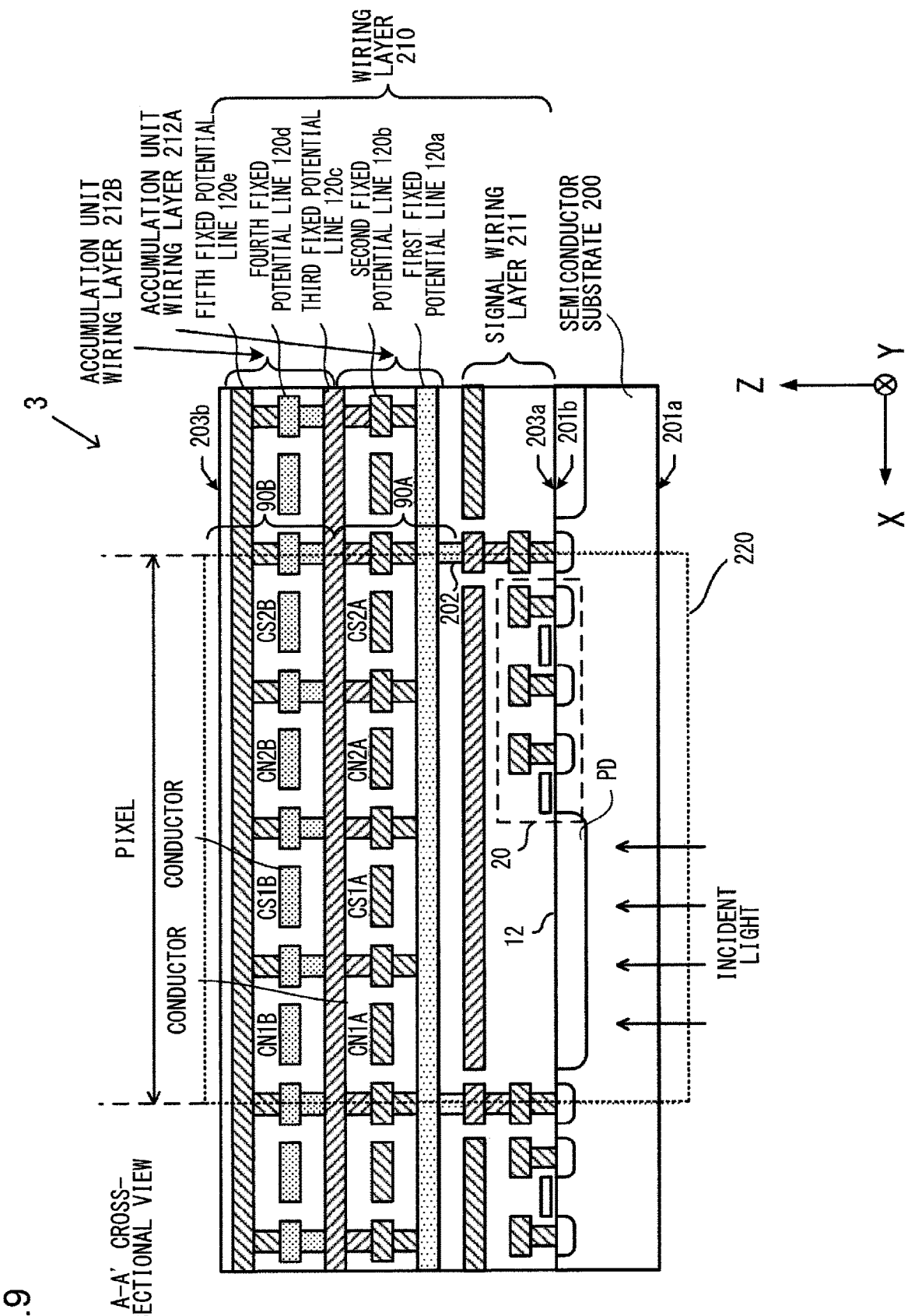
FIG. 9 is a view illustrating an example of a cross-sectional structure of the image sensor according to the second embodiment.

FIG. 9 is a view illustrating an example of a cross-sectional structure of the image sensor 3 according to the second embodiment. FIG. 9 is a cross-sectional view taken along a line A-A' in FIG. 10 (described later). The wiring layer 210 is provided with an accumulation unit wiring layer 212A having accumulation units 90A (accumulation units 90A1-90A3) and an accumulation unit wiring layer 212B having accumulation units 90B (accumulation units 90B1-90B3). The accumulation unit wiring layer 212B is provided to be stacked on the accumulation unit wiring layer 212A in the pixel region 220 of the second surface 201b of the semiconductor substrate 200. Additionally, the size of each of the accumulation units 90A and 90B corresponds to the size of one column of the pixels 10.

As illustrated in FIG. 9, the fixed potential line 120 has a first fixed potential line 120a, a second fixed potential line 120b, a third fixed potential line 120c, a fourth fixed potential line 120d, and a fifth fixed potential line 120e, which are formed by conductor films in different layers. In the accumulation unit wiring layer 212A, capacitances are formed mainly between each of the conductors CN1A, CS1A, CN2A, CS2A and the first to third fixed potential lines 120a-120c. Furthermore, in the accumulation unit wiring layer 212B, capacitances are formed mainly between each of the conductors CN1B, CS1B, CN2B, CS2B and the third to fifth fixed potential lines 120c-120e. The third fixed potential line 120c functions as a shield between the conductors CN1A, CS1A, CN2A, CS2A of the accumulation unit 90A and the conductors CN1B, CS1B, CN2B, CS2B of the accumulation unit 90B.

Figure 10:
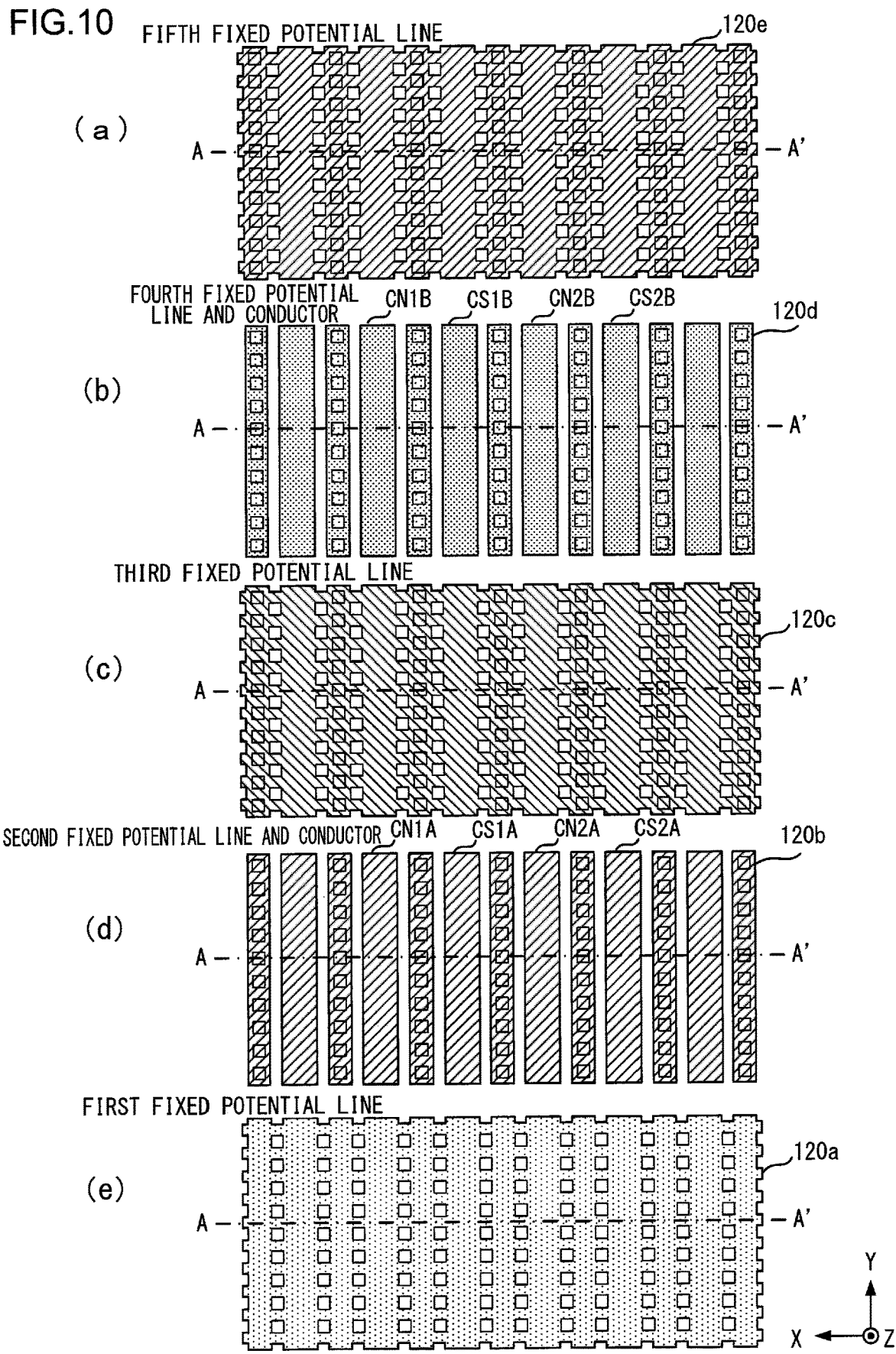
FIG. 10 is a view illustrating a planar layout example of a part of the accumulation unit wiring layer of the image sensor according to the second embodiment.

FIG. 10 is a view illustrating a planar layout example of a part of the accumulation unit wiring layer 212 of the image sensor 3 according to the second embodiment. FIG. 10(a) is a view illustrating an example of a planar layout of a layer in which the fifth fixed potential line 120e is formed, FIG. 10(b) is a view illustrating an example of a planar layout of a layer in which the fourth fixed potential line 120d and the conductors CN1B, CS1B, CN2B, CS2B are formed, and FIG. 10(c) is a view illustrating an example of a planar layout of a layer in which the third fixed potential line 120c is formed. Furthermore, FIG. 10(d) is a view illustrating an example of a planar layout of a layer in which the second fixed potential line 120b and the conductors CN1A, CS1A, CN2A, CS2A are formed, and FIG. 10(e) is a view illustrating an example of a planar layout of a layer in which the first fixed potential line 120a is formed.

The fifth fixed potential line 120e is formed to cover all the pixels 10 arranged two-dimensionally in a matrix, for example, in the same manner as the third fixed potential line 120c and the first fixed potential line 120a. The fourth fixed potential line 120d is linearly formed in the same manner as the second fixed potential line 120b. In the present embodiment, since the accumulation units 90A and 90B are provided corresponding to the pixel rows of the pixels 10, the lengths in the Y-axis direction of the fourth fixed potential line 120d and the conductors CN1B, CS1B, CN2B, CS2B correspond to the length of one pixel column. The fifth fixed potential line 120e and the fourth fixed potential line 120d are connected to each other through a plurality of vias, the fourth fixed potential line 120d and the third fixed potential line 120c are connected to each other through a plurality of vias.

According to the above-described embodiment, the following operations and effects can be obtained in addition to the same operations and effects as those in the first embodiment.

(13) The accumulation unit 90 includes a first accumulation unit 90A connected to a first plurality of pixels 10 among the plurality of pixels 10 arranged in the first direction and a second accumulation unit 90B connected to a second plurality of pixels 10 among the plurality of pixels 10 arranged in the first direction. In the present embodiment, the image sensor 3 further includes a third layer (an accumulation unit wiring layer 212B) stacked on the second layer (the accumulation unit wiring layer 212A). In this way, an increase in the chip area can be reduced while a plurality of accumulation units 90 can be provided. Additionally, providing a plurality of accumulation units 90 for each pixel column can achieve a simultaneous readout of pixels 10 in a plurality of rows.

Third Embodiment

An image-capturing apparatus according to a third embodiment has the same configuration as that of the image-capturing apparatus 1 according to the first embodiment. The image sensor according to the third embodiment is different from the image sensor in the second embodiment mainly in that the accumulation unit 90A and the accumulation unit 90B are separately arranged without being stacked. Note that parts similar to or equivalent to that in the first embodiment are denoted by the same reference numbers in the figures, and differences between the first and second embodiments will mainly be described.

Figure 11:
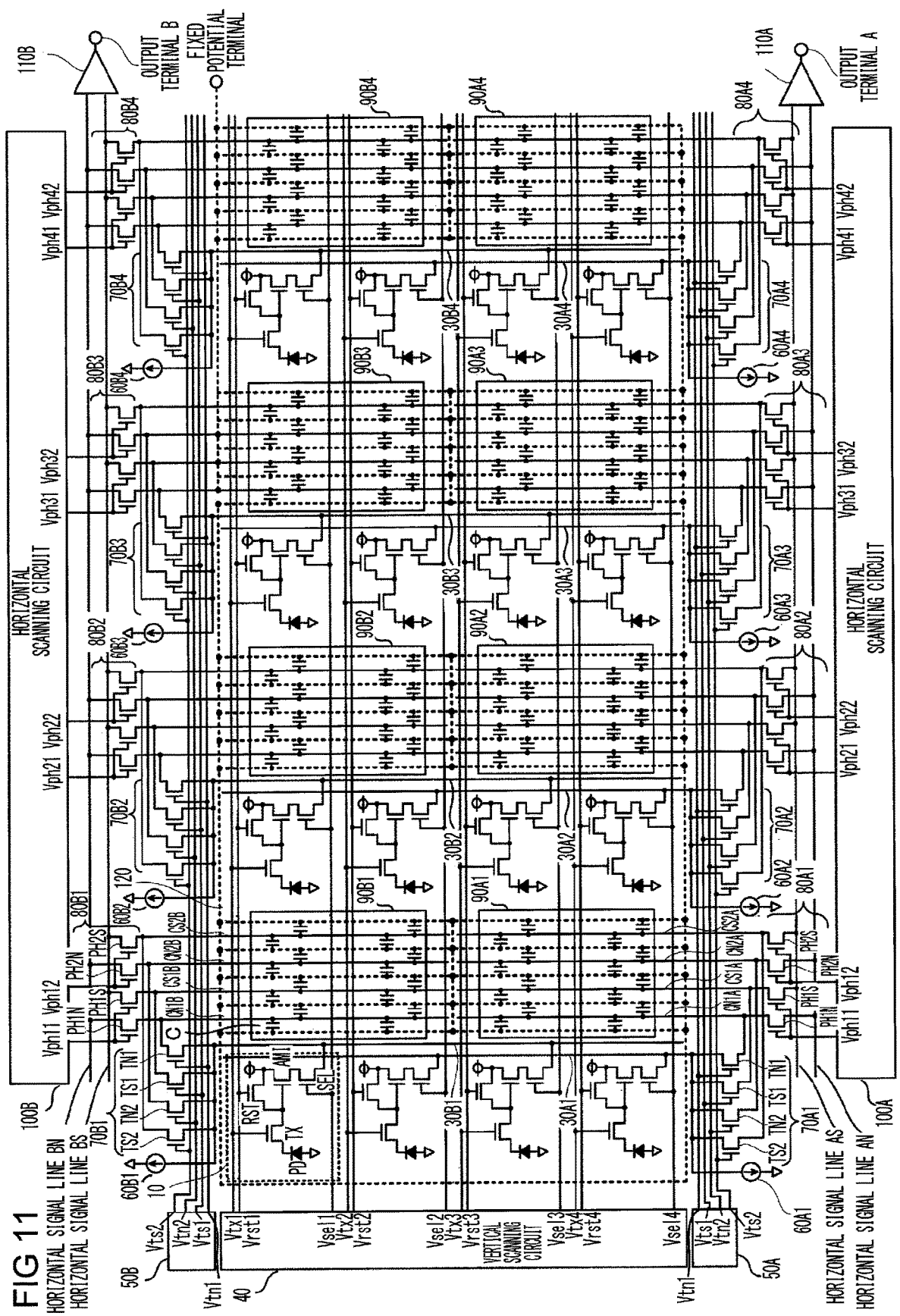
FIG. 11 is a circuit diagram illustrating a configuration of a part of an image sensor according to a third embodiment.

FIG. 11 is a circuit diagram illustrating a configuration of a part of the image sensor 3 according to the third embodiment. The image sensor according to the third embodiment has the same circuit configuration as that of the image sensor 3 according to the second embodiment. In the second embodiment, an example is illustrated in which each of the accumulation unit 90A and the accumulation unit 90B is provided to have a size corresponding to one column of pixels 10. In contrast, in the third embodiment, each of the accumulation unit 90A and the accumulation unit 90B is provided to have a size corresponding to a predetermined number of pixels 10 among pixels 10 in one column. For example, the size of each of the accumulation units 90A and 90B corresponds to the size of a half column of the pixels 10.

Note that the operation of the image sensor 3 according to the third embodiment is the same as that of the image sensor 3 according to the second embodiment.

FIG. 12 is a view illustrating an example of a cross-sectional structure of the image sensor 3 according to the third embodiment. FIG. 12(a) is a cross-sectional view taken along a line A-A' in FIG. 13 (described later) and FIG. 12(b) is a cross-sectional view taken along a line B-B' in FIG. 13 (described later). The accumulation unit wiring layer 212 of the wiring layer 210 is provided with the accumulation units 90A (accumulation units 90A1-90A4) and the accumulation units 90B (accumulation units 90B1-90B4). A cross-sectional view in FIG. 12(a) illustrates an accumulation unit 90B. Furthermore, as illustrated in FIG. 12(b), the conductor film and the insulating film of the same layer are used to form the accumulation unit 90A and the accumulation unit 90B.

Figure 13:
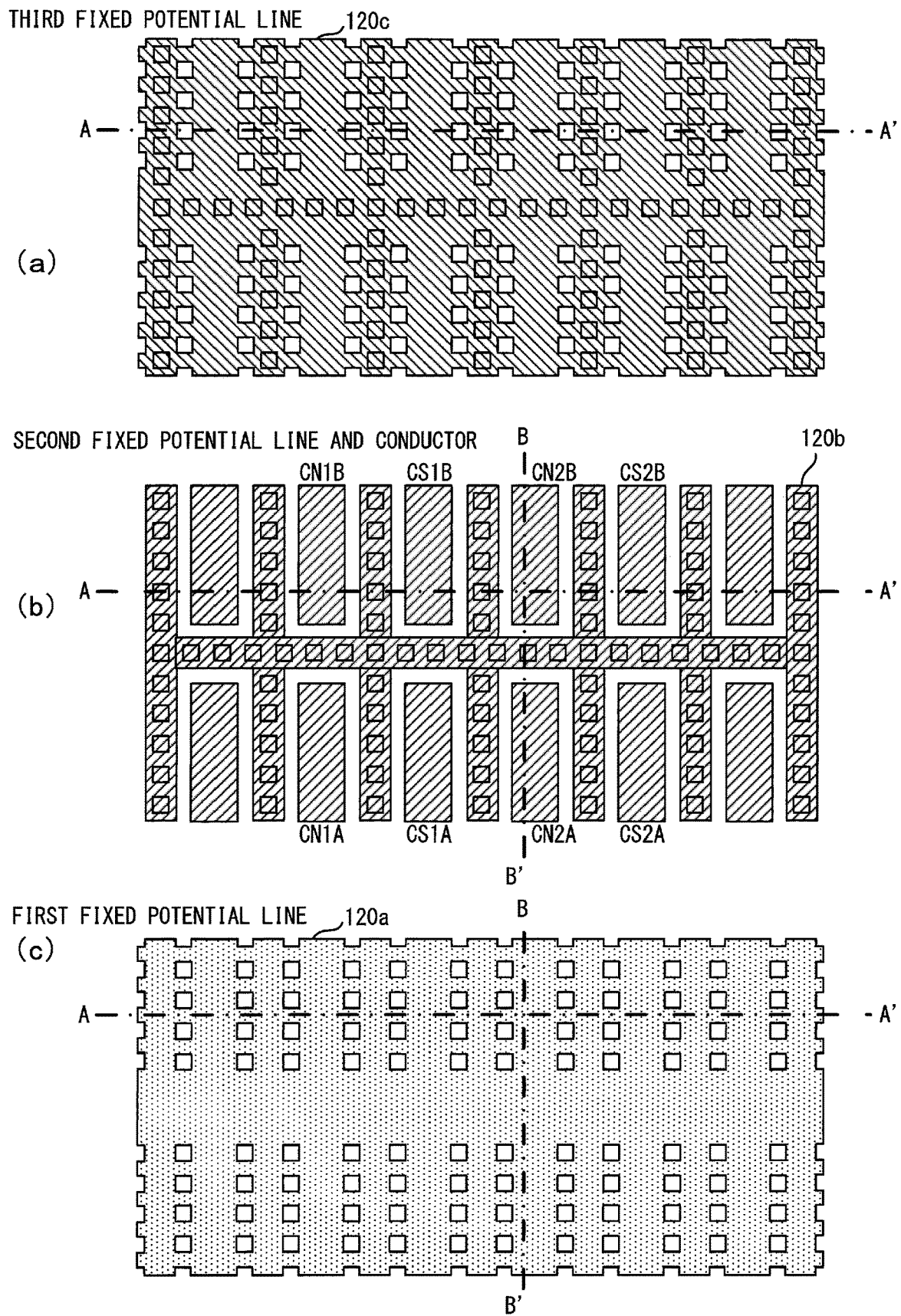
FIG. 13 is a view illustrating a planar layout example of a part of the accumulation unit wiring layer of the image sensor according to the third embodiment.

FIG. 13 is a view illustrating a planar layout example of a part of the accumulation unit wiring layer 210 of the image sensor 3 according to the third embodiment. FIG. 13(a) is a view illustrating an example of a planar layout of a layer in which the third fixed potential line 120c is formed, FIG. 13(b) is a view illustrating an example of a planar layout of a layer in which the second fixed potential line 120b and the conductors CN1A, CS1A, CN2A, CS2A, CN1B, CS1B, CN2B, CS2B are formed, and FIG. 13(c) is a view illustrating an example of a planar layout of a layer in which the first fixed potential line 120a is formed.

The second fixed potential line 120b is arranged between the conductors CN1A, CS1A, CN2A, CS2A of the accumulation unit 90A. Furthermore, the second fixed potential line 120b is arranged between the conductors CN1B, CS1B, CN2B, CS2B of the accumulation unit 90B. In the present embodiment, since the size of each of the accumulation units 90A and 90B corresponds to a size of a predetermined number of pixels 10 among the pixels in one pixel column, the lengths in the Y-axis direction of the conductors CN1A, CS1A, CN2A, CS2A and the conductors CN1B, CS1B, CN2B, CS2B correspond to the lengths of the predetermined number of pixels 10 in one pixel column. Furthermore, the second fixed potential line 120b functions as a shield between the conductors CN1A, CS1A, CN2A, CS2A of the accumulation unit 90A and the conductors CN1B, CS1B, CN2B, CS2B of the accumulation unit 90B.

According to the above-described embodiment, the following operations and effects can be obtained in addition to the same operations and effects as those in the first embodiment.

(14) The accumulation unit 90 includes a first accumulation unit 90A connected to a first plurality of pixels 10 among the plurality of pixels 10 arranged in the first direction and a second accumulation unit 90B connected to a second plurality of pixels 10 among the plurality of pixels 10 arranged in the first direction. In the present embodiment, each of the plurality of accumulation units 90 corresponds to an individual one of the plurality of pixel columns and stores signals read out from the pixels 10 of the corresponding pixel column. The plurality of accumulation units 90 are provided in the pixel region 200 including a predetermined number of pixels in the corresponding pixel column. In this way, the plurality of accumulation units 90 can be arranged without stacking them. Therefore, the number of wiring layers 210 can be reduced.

The following modifications are also included in the scope of the present invention, and one or more of the modifications may be combined with the above-described embodiments.

First Modification

Figure 14:
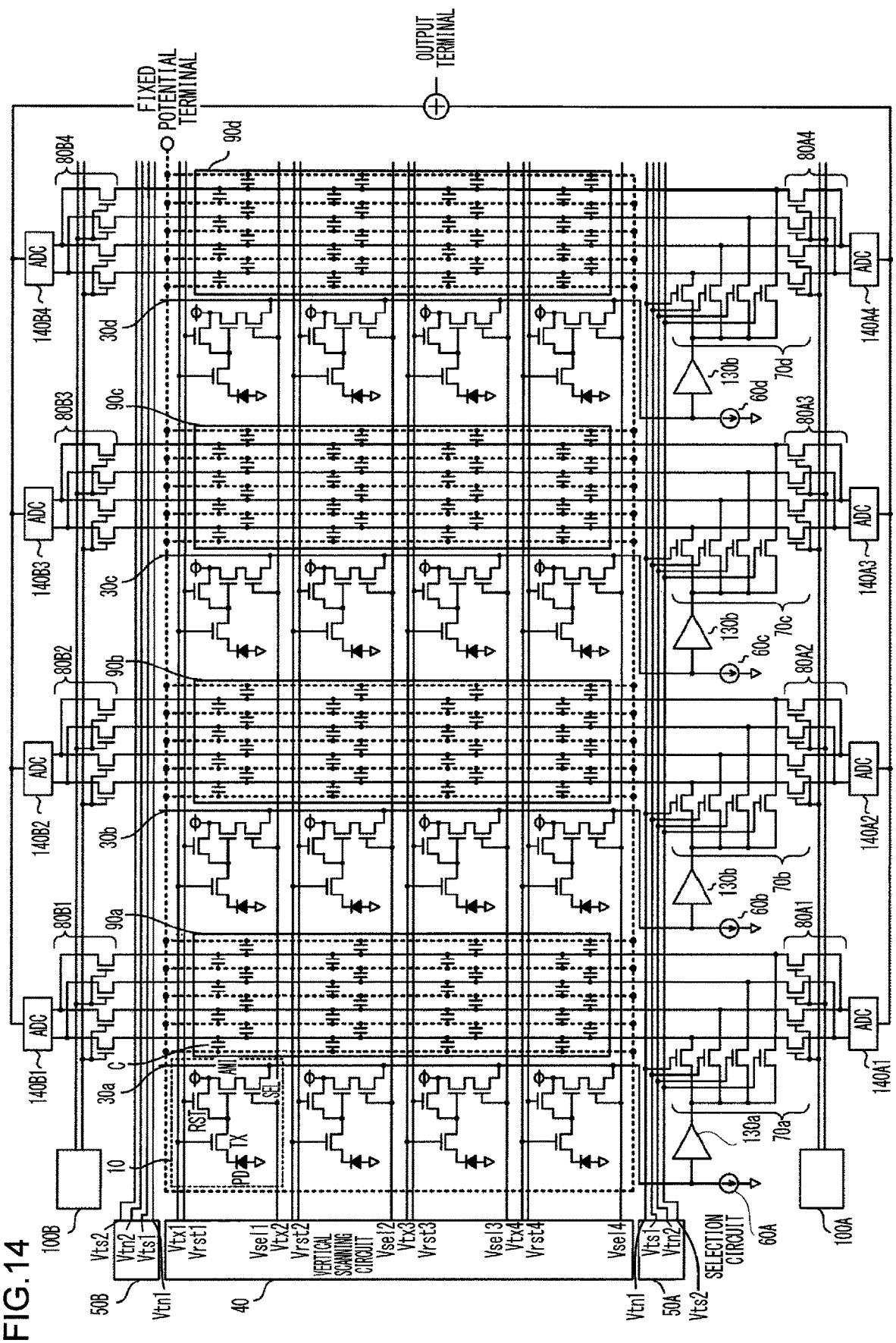
FIG. 14 is a circuit diagram illustrating a configuration of a part of an image sensor according to a first modification.

FIG. 14 is a circuit diagram illustrating a configuration of a part of an image sensor 3 according to a first modification. The image sensor 3 according to the first modification is provided with amplifiers (buffers) 130 connected to respective vertical signal lines 30. The amplifier 130 (amplifiers 130a-130d) outputs a signal obtained by amplifying a signal read out from a pixel 10. This can reduce a signal delay and a reduction in a signal level between each pixel 10 and each accumulation unit 90. As a result, a readout at a high frame rate can also be performed when the capacitance of the accumulation unit 90 is large, for example.

Additionally, the image sensor 3 according to the first modification is provided with two analog/digital conversion circuits (the AD conversion circuit 140A and the AD conversion circuit 140B) for each pixel column. The AD conversion circuit 140A and the AD conversion circuit 140B each output a digital signal based on a difference between a photoelectric conversion signal and a noise signal from the corresponding pixel column. The digital signal output from the AD conversion circuit 140A and the digital signal output from the AD conversion circuit 140B are averaged. The digital signal output from the AD conversion circuit 140A1 and the digital signal output from the AD conversion circuit 140B1 are averaged, and the digital signal output from the AD conversion circuit 140A2 and the digital signal output from the AD conversion circuit 140B2 are averaged. Similarly, the digital signal output from the AD conversion circuit 140A3 and the digital signal output from the AD conversion circuit 140B3 are averaged, and the digital signal output from the AD conversion circuit 140A4 and the digital signal output from the AD conversion circuit 140B4 are averaged. The averaged signal is output to an output terminal illustrated in FIG. 14. In the present modification, each of the AD conversion circuits 140A and 140B converts a signal from the pixels 10 accumulated in the accumulation unit 90 into a digital signal to average two digital signals. Therefore, a signal having a reduced noise contamination during a transfer of a signal from the accumulation unit 90 to the second switch unit 80 can be output to the output terminal.

Second Modification

In the above-described embodiment, an example has been described in which capacitances caused by conductors are provided as capacitances for accumulating a photoelectric conversion signal and a noise signal. However, capacitances made of materials other than conductors may be provided to be stacked on the second surface 201b of the semiconductor substrate.

Third Modification

In the above-described embodiment, an example has been described in which the signal wiring layer 211 is stacked on the second surface 201b of the semiconductor substrate 200, and the accumulation unit wiring layer 212 is stacked on the signal wiring layer 211. However, the accumulation unit wiring layer 212 may be stacked on the second surface 201b of the semiconductor substrate 200, and the signal wiring layer 211 may be stacked on the accumulation unit wiring layer 212. Additionally, the accumulation unit wiring layer 212 may be stacked on the second surface 201b of the semiconductor substrate 200 via a conductor film or an insulating film, or directly.

Fourth Modification

In the above-described embodiment, an example has been described in which the image sensor 3 has a back illuminated configuration. However, the image sensor 3 may have a front side illumination type configuration in which the wiring layer 210 is provided on a light incident surface on which light is incident. In this case, the image sensor 3 has a configuration in which light is incident on the second surface 201b of the semiconductor substrate 200. A plurality of pixels 10 are arranged in a first direction (e.g., column direction) and a second direction (e.g., row direction) intersecting the first direction. The accumulation units 90 may be arranged between a plurality of pixels, for example, between a plurality of pixels arranged in the second direction.

Fifth Modification

In the above embodiments and modifications, the accumulation units 90 that accumulate photoelectric conversion signals and noise signals from the pixels 10 have been described. However, the accumulation units may also be applied as accumulation units of another circuit included in the image sensor 3.

Although various embodiments and variations have been described above, the present invention is not limited to these. Other aspects contemplated within the technical idea of the present invention are also included within the scope of the present invention.

The disclosure of the following priority application is herein incorporated by reference:

Japanese Patent Application No. 2016-38161 (filed Feb. 29, 2016)

REFERENCE SIGNS LIST

3 . . . image sensor, 12 . . . photoelectric conversion unit, 20 . . . readout unit, 90 . . . accumulation unit, 200 . . . semiconductor substrate

The invention claimed is:

1. An image sensor comprising:
a semiconductor substrate that includes a plurality of pixels arranged in a row direction and a column direction, each pixel including a photoelectric converter that converts light into an electric charge, and the plurality of pixels outputting signals based on the charges converted by the photoelectric converters; and
a wiring layer having (i) a first signal line, which is connected to a first pixel of the plurality of pixels and to which signals of the plurality of pixels are output, and (ii) a first storage that accumulates the signals output to the first signal line, wherein
the semiconductor substrate has a first surface onto which light is incident and a second surface opposite the first surface, and
the wiring layer is located on the second surface of the semiconductor substrate.

2. The image sensor according to claim 1, further comprising:
a first connection for electrically connecting the first signal line to the first storage.

3. The image sensor according to claim 1, further comprising:
a first processor that processes the signals held by the first storage; and
a second connection for electrically connecting the first storage to the first processor.

4. The image sensor according to claim 3, wherein:
the first processor is a circuit that removes noise components from the signals held in the first storage.

5. The image sensor according to claim 4, wherein:
the first storage holds the signals based on the electric charges converted by the photoelectric converters; and
the image sensor further comprises a second wiring that holds the signals including the noise components.

6. The image sensor according to claim 5, wherein:
the first signal line and a first fixed potential line to which a predetermined potential is applied are located between the first wiring and the second wiring, and
a second fixed potential line is located between the first wiring and the second wiring.

7. The image sensor according to claim 3, wherein:
the first processor is an AD conversion circuit that converts an analog signal held in the first storage into a digital signal.

8. The image sensor according to claim 1, wherein:
a predetermined potential is applied to the first storage.

9. An imaging device comprising:
the image sensor according to claim 1; and
an image generator that generates image data based on the signals of the image sensor.

10. The image sensor according to claim 1, wherein:
the wiring layer includes (i) a second signal line, which is electrically connected to a second pixel of the plurality of pixels that is arranged side-by-side with the first pixel in the row direction and to which signals of the plurality of signals are output, and (ii) a second storage that accumulates the signals output to the second signal line.

11. The image sensor according to claim 10, further comprising:
a third connection for electrically connecting the second signal line and the second storage.

12. The image sensor according to claim 11, further comprising:
a second processor that processes the signals held by the second storage; and
a fourth connection for electrically connecting the second storage to the second processor.

13. The image sensor according to claim 12, wherein:
the second processor is a circuit that removes noise components from the signals held in the second storage.

14. The image sensor according to claim 12, wherein:
the second processor is an AD conversion circuit that converts an analog signal held in the second storage into a digital signal.

15. The image sensor according to claim 10, wherein:
a predetermined potential is applied to the second storage.

16. An imaging device comprising:
the image sensor according to claim 10; and
an image generator that generates image data based on the signals of the image sensor.

\* \* \* \* \*